US011188704B2

(12) United States Patent
Kim et al.

(10) Patent No.: US 11,188,704 B2
(45) Date of Patent: *Nov. 30, 2021

(54) INTEGRATED CIRCUIT INCLUDING A MODIFIED CELL AND A METHOD OF DESIGNING THE SAME

(71) Applicant: SAMSUNG ELECTRONICS CO., LTD., Suwon-si (KR)

(72) Inventors: Jin-Tae Kim, Daejeon (KR); Jung-Ho Do, Hwaseong-si (KR); Tae-Joong Song, Seongnam-si (KR); Doo-Hee Cho, Goyang-si (KR); Seung-Young Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/915,369

(22) Filed: Jun. 29, 2020

(65) Prior Publication Data

US 2020/0334407 A1  Oct. 22, 2020

Related U.S. Application Data

(63) Continuation of application No. 15/585,548, filed on May 3, 2017, now Pat. No. 10,726,186.

(30) Foreign Application Priority Data

Oct. 5, 2016 (KR) .......................... 10-2016-0128508

(51) Int. Cl.
*G06F 30/33* (2020.01)
*G06F 30/394* (2020.01)
*G06F 30/392* (2020.01)

(52) U.S. Cl.
CPC .......... *G06F 30/394* (2020.01); *G06F 30/392* (2020.01)

(58) Field of Classification Search
CPC .. G06F 21/79; G06F 21/86; G06F 2221/2129; G06F 30/392; G06F 30/398;
(Continued)

(56) References Cited

U.S. PATENT DOCUMENTS 5,737,236 A  4/1998 Maziasz et al.
8,698,205 B2  4/2014 Tzeng et al.
(Continued)

OTHER PUBLICATIONS

Hwang, Chi-Yi, et al., "An Efficient Layout Style for 2-Metal CMOS Leaf Cells and Their Automatic Generation", 28TH ACM/IEEE Design Automation Conference, 1991, pp. 481-486.
Mishra, Prateek et al.,"FinFET Circuit Design", Nanoelectric Circuit Design, Springer Science—Business Media, LLC 2011, pp. 23-55.

*Primary Examiner* — Binh C Tat
(74) *Attorney, Agent, or Firm* — F. Chau & Associates, LLC

(57) ABSTRACT

A method of designing an integrated circuit includes receiving input data defining the integrated circuit, receiving information from a standard cell library including a plurality of standard cells, receiving information from a modified cell library including at least one modified cell having a same function as a corresponding standard cell among the plurality of standard cells and having a higher routability than the corresponding standard cell and generating output data by performing placement and routing in response to the input data, the information from the standard cell library and the information from the modified cell library.

18 Claims, 33 Drawing Sheets

(58) Field of Classification Search
CPC ........ G06F 11/079; G06F 30/30; G06F 30/39; G06F 2111/04; G06F 30/394; G06F 12/0207; G06F 12/04; G06F 12/0607; G06F 13/16; G06F 13/1673; G06F 13/1689; G06F 13/28; G06F 9/3867; G06F 9/4494; G06F 2111/20; G06F 30/3312; G06F 30/35; G06F 30/367; B41J 2/1631; B41J 2/04541; G01R 31/2831; G01R 31/2884; G01R 31/307; H01L 23/528; H01L 21/8221; H01L 27/1203; H01L 29/0661; H01L 27/0207; H01L 21/76846; H01L 21/823493; H01L 21/823892; H01L 27/0886; H01L 27/0924; H01L 29/66795; H01L 29/785; H01L 27/11807; H01L 2224/73267; H01L 23/49816; H01L 2924/15311; H01L 23/5386; G06K 19/06037; G06K 7/14

USPC .................................. 716/100–106, 126–131
See application file for complete search history.

(56) References Cited

U.S. PATENT DOCUMENTS

| | | | |
|---|---|---|---|
| 8,739,104 B1 * | 5/2014 | Penzes | H01L 27/11807 716/122 |
| 9,007,095 B2 | 4/2015 | Penzes | |
| 9,070,552 B1 | 6/2015 | Shah et al. | |
| 9,292,644 B2 | 3/2016 | Loh et al. | |
| 10,726,186 B2 * | 7/2020 | Kim | G06F 30/394 |
| 2005/0076316 A1 | 4/2005 | Pierrat et al. | |
| 2010/0155783 A1 * | 6/2010 | Law | H01L 27/0207 257/206 |
| 2016/0055286 A1 | 2/2016 | Baek et al. | |
| 2016/0300005 A1 * | 10/2016 | Yang | G06F 30/392 |
| 2017/0033101 A1 | 2/2017 | Sharma et al. | |
| 2018/0096092 A1 | 4/2018 | Kim et al. | |

\* cited by examiner

AA-AA'

BB-BB'

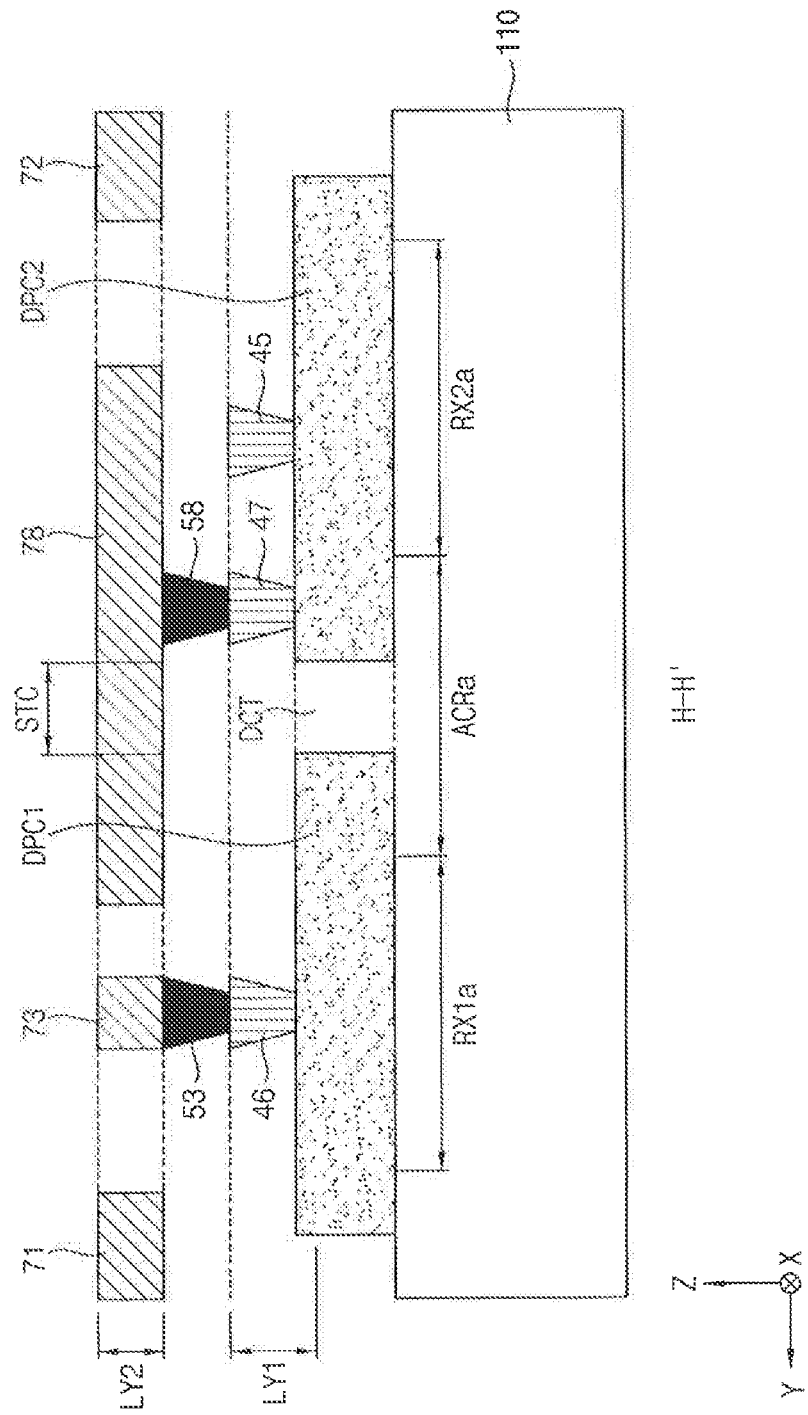

I-I'

J-J'

INTEGRATED CIRCUIT INCLUDING A MODIFIED CELL AND A METHOD OF DESIGNING THE SAME

CROSS-REFERENCE TO RELATED APPLICATIONS

This U.S. Non-provisional patent application is a continuation of U.S. patent application Ser. No. 15/585,548 filed on May 3, 2017 which claims priority under 35 U.S.C. § 119 to Korean Patent Application No. 10-2016-0128508, filed on Oct. 5, 2016, in the Korean Intellectual Property Office (KIPO), the disclosures of which are incorporated by reference herein in their entireties.

TECHNICAL FIELD

Exemplary embodiments of the present inventive concept relate generally to semiconductor integrated circuits, and more particularly, to an integrated circuit including a modified cell and a method of designing the integrated circuit.

DISCUSSION OF THE RELATED ART

Standard cells having fixed functions may be used in the design of integrated circuits. The standard cells have predetermined architectures and are stored in cell libraries. When designing integrated circuits, the standard cells are retrieved from the cell libraries and placed into desired locations on an integrated circuit layout. Routing is then performed to connect the standard cells with each other and with other cells.

For example, metal routing wires such as horizontal and/or vertical tracks, which are formed over the standard cells, may be used to route signals between the standard cells. Routability may be improved as the number of the pin points for input and output signals of the standard cell is increased. However, the area of the standard cell is increased as the number of the pin points is increased.

SUMMARY

According to an exemplary embodiment of the present inventive concept, a method of designing an integrated circuit includes receiving input data defining the integrated circuit, receiving information from a standard cell library including a plurality of standard cells, receiving information from a modified cell library including at least one modified cell having a same function as a corresponding standard cell among the plurality of standard cells and having a higher routability than the corresponding standard cell and generating output data by performing placement and routing in response to the input data, the information from the standard cell library and the information from the modified cell library.

According to an exemplary embodiment of the present inventive concept, an integrated circuit includes a plurality of standard cells and at least one modified cell having a same function as a corresponding standard cell among the plurality of standard cells and having a higher routability than the corresponding standard cell.

According to an exemplary embodiment of the present inventive concept, an integrated circuit includes a plurality of standard cells; and at least one first modified standard cell and at least one second modified standard cell, wherein each of the at least one first modified standard cell and the at least one second modified standard cell has a same function as a corresponding standard cell among the plurality of standard cells and has a higher routability than the corresponding standard cell, a width of a power rail of the at least one first modified standard cell is smaller than a width of a power rail of the corresponding standard cell, and the at least one second modified standard cell includes a dummy gate line.

According to an exemplary embodiment of the present inventive concept, there is provided an integrated circuit including: a plurality of standard cells; and a modified standard cell, wherein the modified standard cell includes a first power rail disposed at a first side of the modified standard cell, wherein a width of the first power rail of the modified standard cell is less than a width of a first power rail of a first standard cell, and the first standard cell and the modified standard cell have the same function as each other.

BRIEF DESCRIPTION OF THE DRAWINGS

The above and other features of the present inventive concept will become more clearly understood by describing in detail exemplary embodiments thereof with reference to the accompanying drawings.

FIGS. 19A, 19B and 19C are cross-sectional views of a padding cell that may have the same layout as the padding cell of FIG. 18, according to an exemplary embodiment of the present inventive concept.

DETAILED DESCRIPTION OF THE EMBODIMENTS

Figure 1:
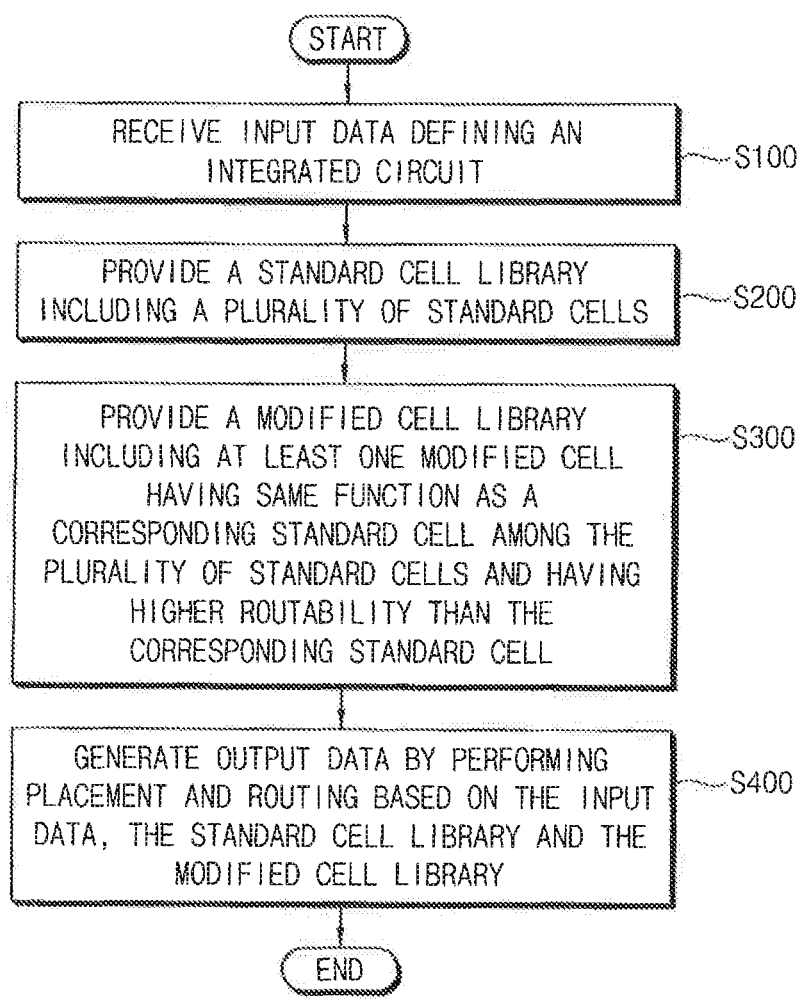
FIG. 1 is a flow chart illustrating a method of designing an integrated circuit according to an exemplary embodiment of the present inventive concept.

Exemplary embodiments of the present inventive concept will be described more fully hereinafter with reference to the accompanying drawings. In the drawings, like numerals may refer to like elements, and thus, repeated descriptions may be omitted.

FIG. 1 is a flow chart illustrating a method of designing an integrated circuit according to an exemplary embodiment of the present inventive concept.

Referring to FIG. 1, input data defining the integrated circuit may be received (S100). For example, an integrated circuit may be defined by a plurality of cells and the integrated circuit may be designed using a cell library including information of the plurality of cells. Hereinafter, a cell may be a standard cell or a modified cell, and a cell library may be a standard cell library or a modified cell library.

In an exemplary embodiment of the present inventive concept, the input data may be data generated from an abstract form with respect to behavior of the integrated circuit. For example, the input data may be defined in a register transfer level (RTL) through synthesis using the standard cell library. For example, the input data may be a bitstream or a netlist that is generated by synthesizing the integrated circuit defined by a hardware description language (HDL) such as VHSIC hardware description language (VHDL) or Verilog.

In an exemplary embodiment of the present inventive concept, the input data may be data for defining the layout of the integrated circuit. For example, the input data may include geometric information for defining a structure implemented as a semiconductor material, a metal, and an insulator. A layer of the integrated circuit indicated by the input data may have a layout of the cells and conducting wires used to connect a cell to other cells, for example.

A standard cell library including a plurality of standard cells may be provided (S200). The term "standard cell" may refer to a unit of an integrated circuit in which a size of the layout meets a preset rule. The standard cell may include an input pin and an output pin and may process a signal received through the input pin to output a signal through the output pin. For example, the standard cell may be a basic cell such as an AND logic gate, an OR logic gate, a NOR logic gate, or an inverter, a complex cell such as an OR/AND/INVERTER (OAI) or an AND/OR/INVERTER (AO), and a storage element such as a master-slave flip flop or a latch.

The standard cell library may include information about a plurality of standard cells. For example, the standard cell library may include a name and a function of a standard cell, as well as timing information, power information, and layout information of the standard cell. The standard cell library may be stored in a storage device and the standard cell library may be provided by accessing the storage device.

A modified cell library including at least one modified cell may be provided (S300). The modified cell has the same function as a corresponding standard cell among the plurality of standard cells and has a higher routability than the corresponding standard cell. In an exemplary embodiment of the present inventive concept, the routability may correspond to the number of pin points for signal output and signal input of a cell. A pin point may be referred to as a pin target or a pin position. The routability of a cell may be increased as the number of the pin points is increased. In addition, the mutability of a cell may depend on various factors other than the number of pin points. For example, the routability of a cell may also depend on a configuration and disposition of input pins and output pins.

The modified cell library may include information about at least one modified cell. For example, the modified cell library may include a name and a function of the modified cell, as well as timing information, power information, and layout information of the modified cell. The modified cell library may be stored in a storage device and the modified cell library may be provided by accessing the storage device.

In an exemplary embodiment of the present inventive concept, a hybrid cell may be provided as the modified cell such that a width of a power rail of the hybrid cell is smaller than a width of a power rail of a corresponding standard cell. In an exemplary embodiment of the present inventive concept, a padding cell may be provided as the modified cell such that the padding cell further includes a dummy gate line that is not included in its corresponding standard cell.

Output data may be generated by performing placement and routing based on the input data, the standard cell library and the modified cell library (S400). In an exemplary embodiment of the present inventive concept, when the received input data are data such as a bitstream or a netlist generated by synthesizing the integrated circuit, the output data may be the bitstream or the netlist. In an exemplary embodiment of the present inventive concept, when the received input data are data defining the layout of the integrated circuit, for example, data having a graphic data system II (GDSII) format, a format of the output data may also be data defining the layout of the integrated circuit.

According to an exemplary embodiment of the present inventive concept, the occupation area of the integrated circuit may be reduced by using the modified cell that has the same function as the standard cell and increased routability compared with the standard cell.

Figure 2A:
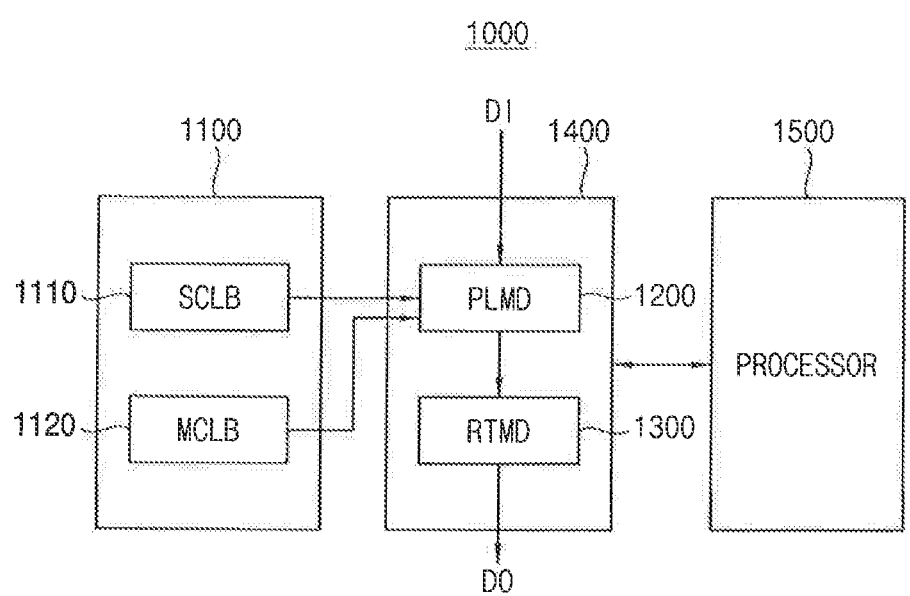
FIG. 2A is a block diagram illustrating a designing system of an integrated circuit according to an exemplary embodiment of the present inventive concept.

FIG. 2A is a block diagram illustrating a designing system of an integrated circuit according to an exemplary embodiment of the present inventive concept.

Referring to FIG. 2A, a designing system 1000 may include a storage medium 1100, a designing module 1400 and a processor 1500.

The storage medium 1100 may store a standard cell library SCLB 1110 and a modified cell library MCLB 1120. The standard cell library 1110 and the modified cell library 1120 may be provided from the storage medium 1100 to the designing module 1400. The standard cell library 1110 may include a plurality of standard cells and the modified cell library 1120 may include at least one modified cell.

The standard cell may be a minimum unit for designing a block, a device or a chip. The modified cell may have the same function as a corresponding standard cell and higher routability than the corresponding standard cell. As an example of the modified cell, a hybrid cell having a power rail with a width smaller than that of a corresponding standard cell will be described below with reference to FIGS. 3 through 7. As another example of the modified cell, a padding cell further including a dummy gate line will be described below with reference to FIGS. 7 through 20.

In an exemplary embodiment of the present inventive concept, the storage medium or the storage device 1100 may include any non-transitory computer-readable storage medium used to provide commands and/or data to a computer. For example, the non-transitory computer-readable storage medium 1100 may include volatile memory such as random access memory (RAM), read only memory (ROM), etc. and nonvolatile memory such as flash memory, magnetoresistive RAM (MRAM), phase-change RAM (PRAM), resistive RAM (RRAM), etc. The non-transitory computer-readable storage medium 1100 may be inserted into the computer, may be integrated in the computer, or may be coupled to the computer through a communication medium such as a network and/or a wireless link.

The designing module 1400 may include a placement module PLMD 1200 and a routing module RTMD 1300.

Herein, the term "module" may indicate, but is not limited to, a software and/or hardware component, such as a field programmable gate array (FPGA) or an application specific integrated circuit (ASIC), which performs certain tasks. A module may be configured to reside in a tangible addressable storage medium and be configured to execute on one or more processors.

The placement module 1200 may, using the processor 1500, arrange standard cells and/or modified cells based on input data D1 defining the integrated circuit, the standard cell library 1110 and the modified cell library 1120. The routing module 1300 may perform signal routing with respect to the cell placement provided from the placement module 1200. If the routing is not successful, the placement module 1200 may modify the previous cell placement and the routing module 1300 may perform the signal routing with the modified cell placement. When the routing is successfully completed, the routing module 1300 may provide output data DO defining the integrated circuit.

The placement module 1200 and the routing module 1300 may be implemented by a single integrated designing module 1400 or may be implemented by separate and different modules. The placement module 1200 and/or the routing module 1300 may be implemented in software, but exemplary embodiments of the present inventive concept are not limited thereto.

The processor 1500 may be used when the designing module 1400 performs a computation. In FIG. 2A, only one processor 1500 is illustrated, but exemplary embodiments of the present inventive concept are not limited thereto. For example, a plurality of processors may be included in the designing system 1000. In addition, the processor 1500 may include cache memories to increase computation capacity.

Figure 2B:
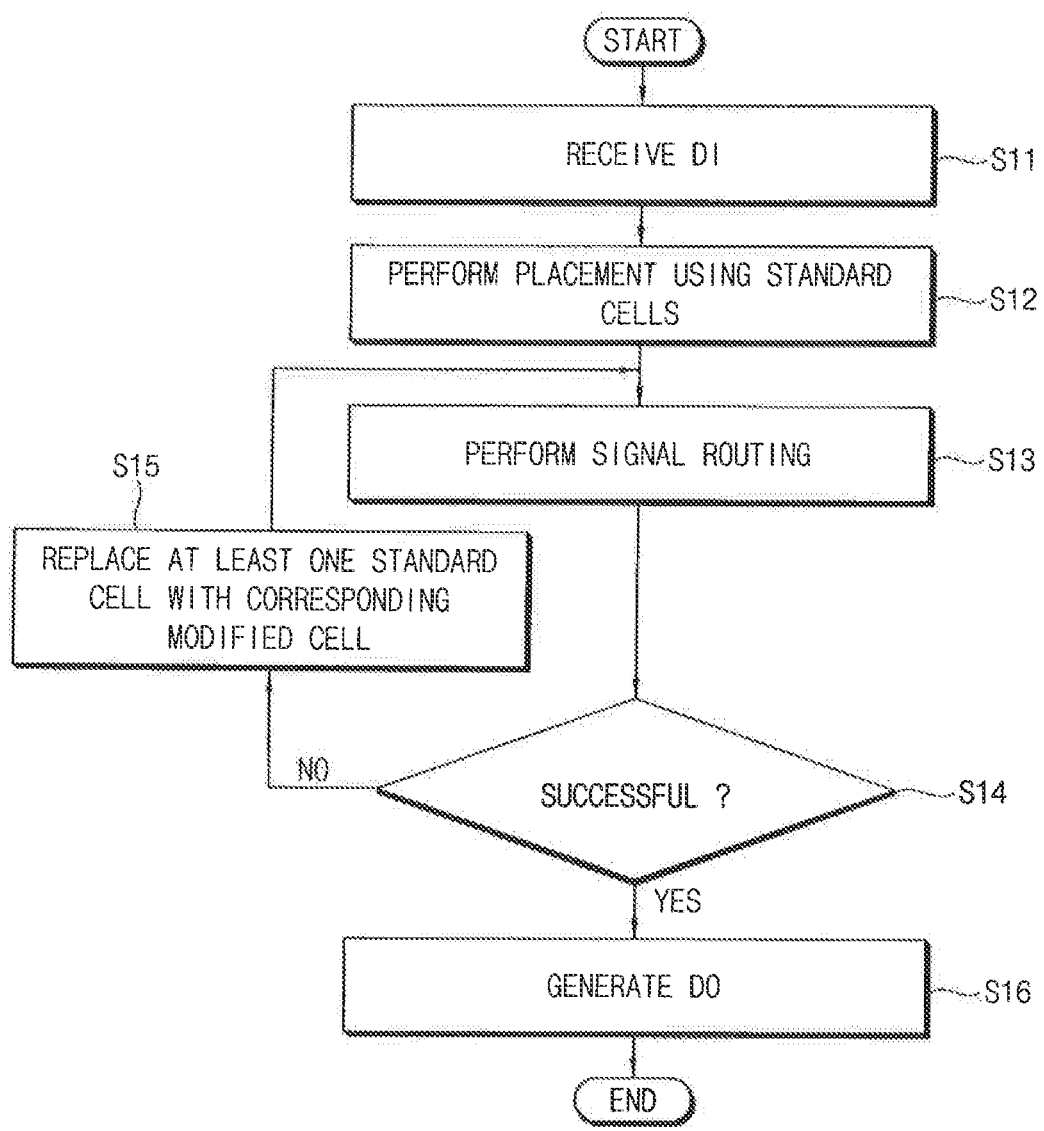
FIG. 2B is a flow chart illustrating an operation of the designing system of FIG. 2A, according to an exemplary embodiment of the present inventive concept.

FIG. 2B is a flow chart illustrating an operation of the designing system of FIG. 2A, according to an exemplary embodiment of the present inventive concept.

Referring to FIGS. 2A and 2B, the designing module 1400 may receive the input data D1 defining the integrated circuit (S11). The placement module 1200 may refer to the standard cell library 1110 to extract standard cells corresponding to the input data D1 and perform cell placement using the extracted standard cells (S12). The routing module 1300 may perform signal routing with respect to the placed cells (S13). When the signal routing is not successful (S14: NO), the placement module 1200 may replace at least one standard cell with a corresponding modified cell (S15) to modify the placement of the cells. The routing module 1300 may perform the signal routing again with respect to the modified cell placement (S13).

As such, the number of the modified cells for replacing the standard cells may be gradually increased until the signal routing is successfully completed. When the signal routing is successfully completed (S14: YES), the designing module 1400 may generate the output data DO defining the integrated circuit (S16).

In an exemplary embodiment of the present inventive concept, as described with reference to FIG. 2B, the original placement and routing may be performed using the standard cells and a standard cell may be replaced with a modified cell only if the original placement and routing is failed. In an exemplary embodiment of the present inventive concept, the original placement and routing may be performed using both of the standard cells and the modified cells.

Hereinafter, structures of a cell and an integrated circuit including a plurality of cells are described using a first direction X, a second direction Y and a third direction Z in a three-dimensional space. The first direction X may be a row direction, the second direction Y may be a column direction and the third direction Z may be a vertical direction.

Figure 3:
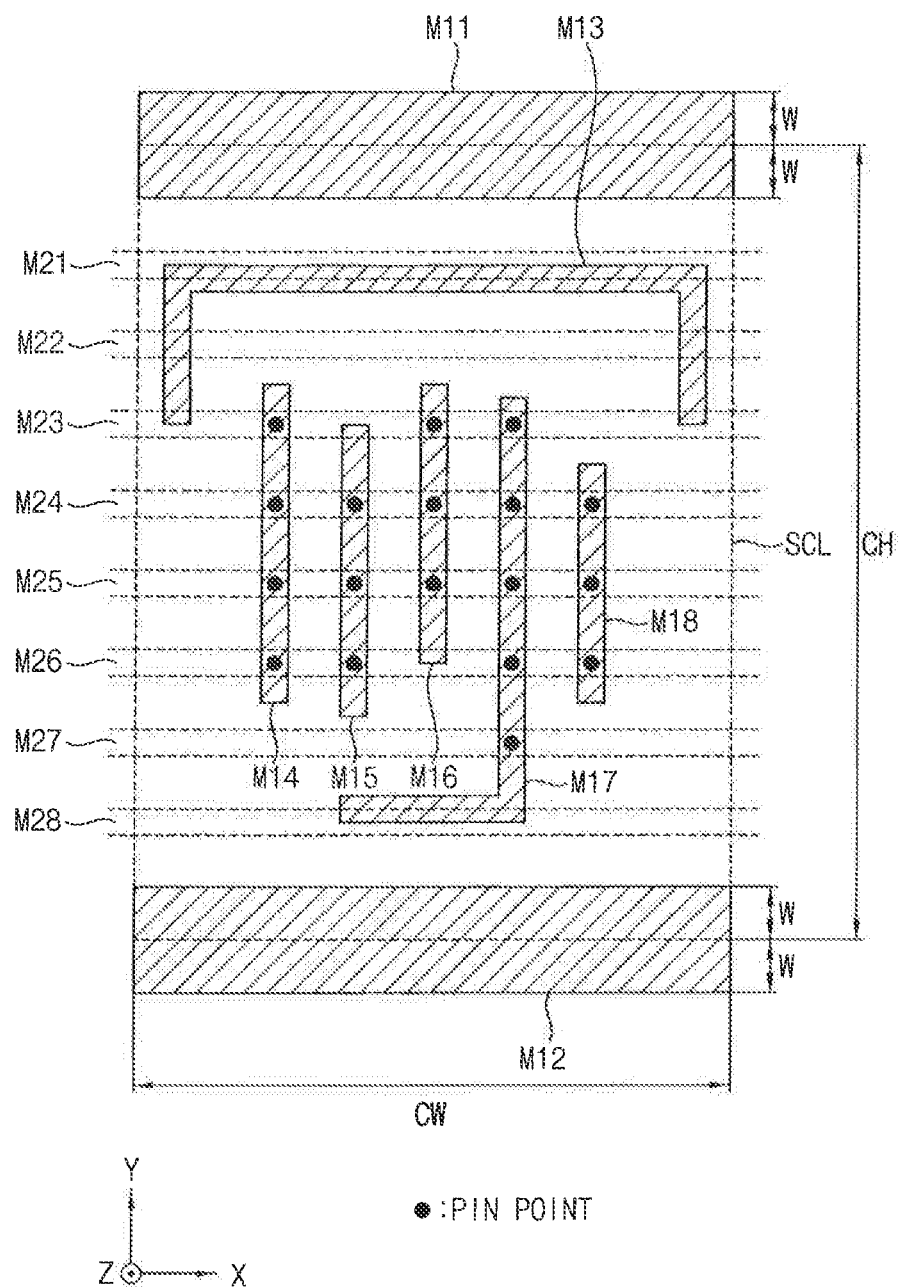
FIG. 3 is a diagram illustrating a layout of an example standard cell.

FIG. 3 is a diagram illustrating a layout of an example standard cell.

Referring to FIG. 3, a standard cell SCL may include a plurality of wirings for voltage supply and signal routing, for example, first through eighth wirings M11~M18. The wirings M11~M18 may include a first power rail M11 and a second power rail M12 that are disposed at boundary portions of the standard cell SCL for providing a power supply voltage and/or a ground voltage. The first power rail M11 and the second power rail M12 may be extended in the first direction X and spaced apart from each other in the second direction Y.

The standard cell SCL may have a predetermined function and a predetermined size such as a cell width CW, a cell height CH, and a width W of the first power rail M11 and the second power rail M12. Routing grids or routing tracts, for example, first through eighth tracts M21-M28, which are formed over the standard cell SCL, are illustrated in FIG. 3. Although FIG. 3 illustrates the row tracts M21~M28 that are extended in the first direction X and arranged in the second direction Y, there may be column tracts that are extended in the second direction Y and arranged in the first direction X. The column tracts may be disposed over the standard cell SCL. In an exemplary embodiment of the present inventive concept, both of the row tracts and the column tracts may be disposed using two wiring layers.

The cross points of the wirings M11~M18 of the standard cell SCL and the routing tracts M21~M28 may correspond to pin points for signal output and the signal input. For example, a pin point may be a position where one of the wirings M11~M18 of the standard cell SCL is electrically connected to one of the routing tracts M21~M28 through a vertical contact such as a via contact. A plurality of pin points may be provided to electrically connect a plurality of the wirings M11~M18 to a plurality of the routing tracts M21~M28.

Distances between the wirings M11~M18 and locations of the pin points may be restricted due to electromagnetic interference between the wirings M11~M18, variations of manufacturing processes, etc. As illustrated in FIG. 3, the fourth wiring M14 may have four pin points, the fifth wiring M15 may have three pin points, the sixth wiring M16 may have three pin points, the seventh wiring M17 may have five pin points and the eighth wiring M18 may have three pin points.

Figure 4A:
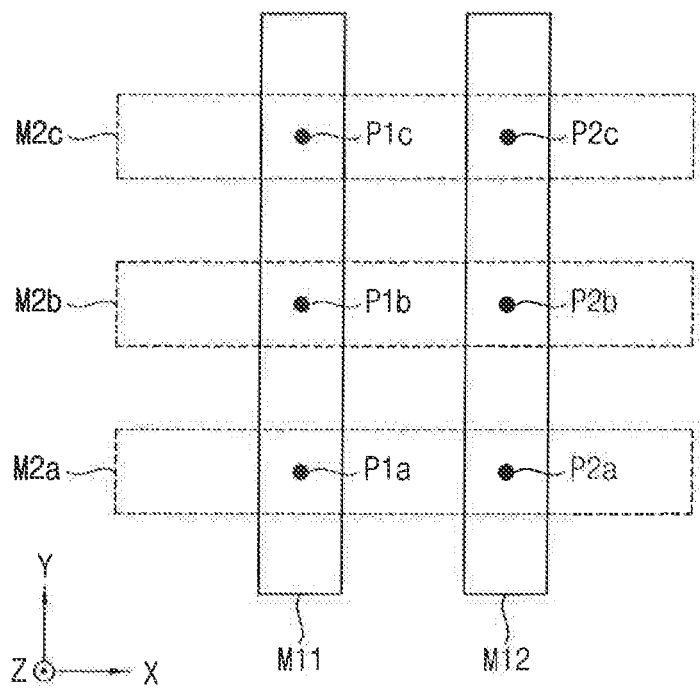
FIGS. 4A and 4B are diagrams for describing pin points for signal output and signal input of a cell.
Figure 4B:
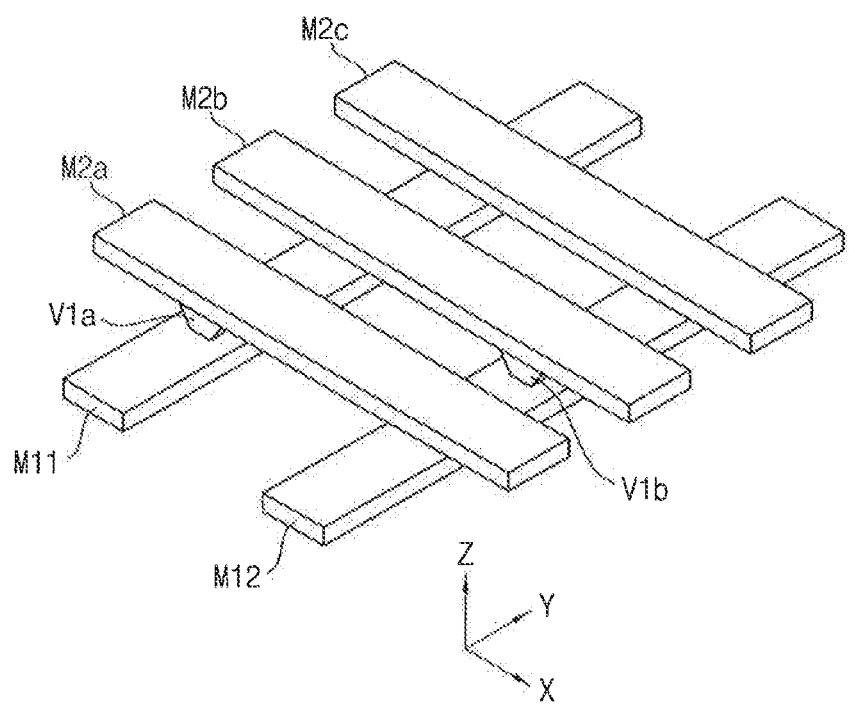

FIGS. 4A and 4B are diagrams for describing pin points for signal output and signal input of a cell.

FIGS. 4A and 4B illustrate a multi-layer wiring structure including, for example, lower wirings M11 and M12 and upper wirings M2a M2b and M2c. As illustrated in FIGS. 4A and 4B, the lower wirings M11 and M12 may be extended in parallel to each other in the second direction Y and the upper wirings M2a, M2b and M2c may be extended in parallel to each other in the first direction X. The lower wirings M11 and M12 may correspond to the above-described wirings of the standard cell and the upper wirings M2a, M2b and M2c may correspond to the above-described routing tracts.

The cross points of the lower wirings M11 and M12 and the upper wirings M2a, M2b and M2c may be pin points P1a, P1b, P1c, P2a, P2b and P2c. FIG. 4B illustrates an example signal routing. Via contacts V1a and V1b may be formed at the two pinpoints P1a and P2b to electrically connect the first lower wiring M11 and the first upper wiring M2a and electrically connect the second lower wiring M12 and the second upper wiring M2b.

Figure 5:
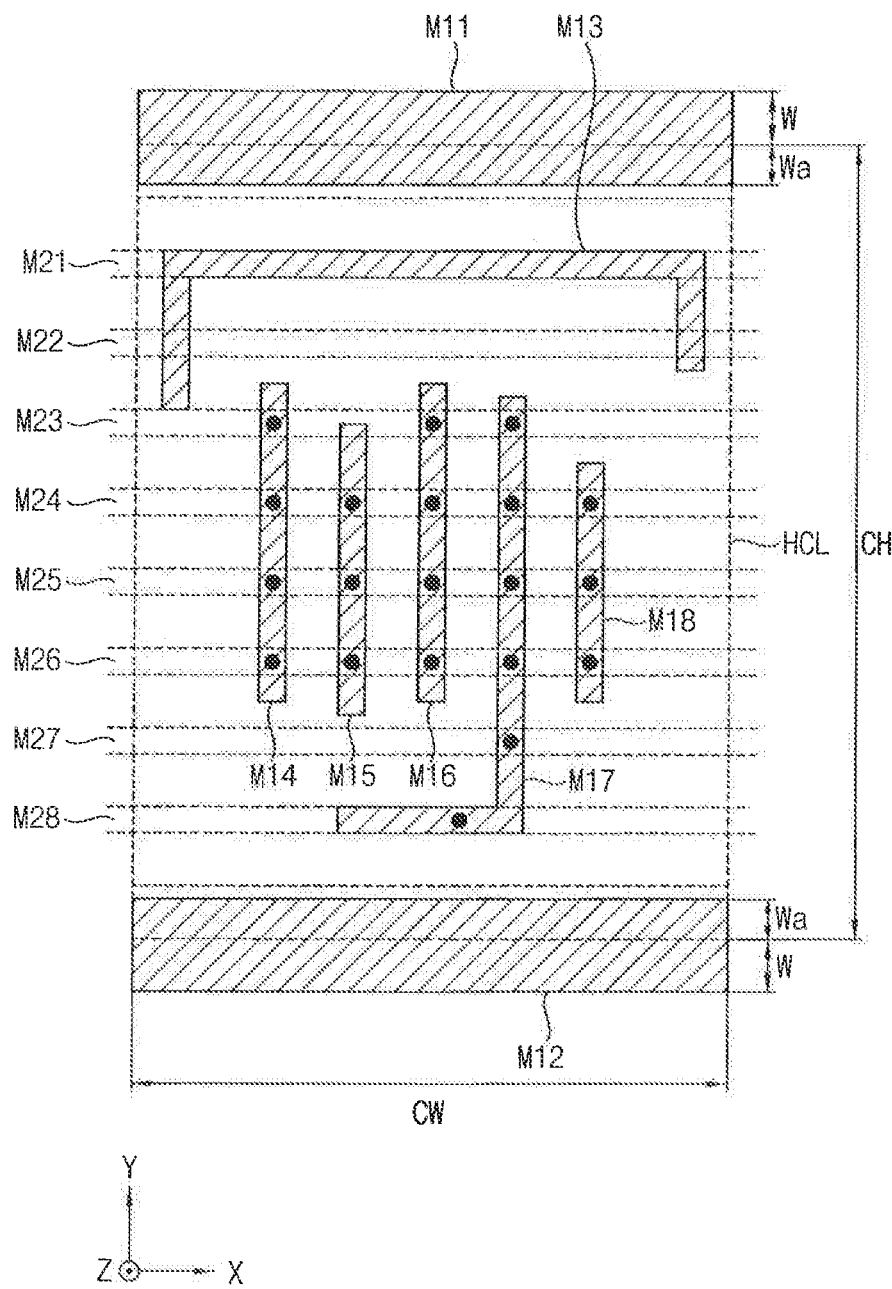
FIG. 5 is a diagram illustrating a layout of a hybrid cell according to an exemplary embodiment of the present inventive concept.

FIG. 5 is a diagram illustrating a layout of a hybrid cell according to an exemplary embodiment of the present inventive concept.

A hybrid cell HCL of FIG. 5 may be a modified cell corresponding to the standard cell SCL of FIG. 3. The hybrid cell HCL of FIG. 5 may have a layout similar to that of the standard cell SCL of FIG. 3, and thus, repeated descriptions may be omitted.

Referring to FIG. 5, the hybrid cell HCL may include a plurality of wirings for voltage supply and signal routing, for example, first through eighth wirings M11~M18. The wirings M11~M18 may include a first power rail M11 and a second power rail M12 that are disposed at boundary portions of the hybrid cell HCL for providing a power supply voltage and/or a ground voltage. The first power rail M11 and the second power rail M12 may be extended in the first direction X and spaced apart from each other in the second direction Y.

The hybrid cell HCL may have the same function as the corresponding standard cell SCL. In addition, the hybrid cell HCL may have the same size as the corresponding standard cell SCL. In other words, the cell width CW and the cell height CH of the hybrid cell HCL may be equal to those of the standard cell SCL.

The width Wa of the first and second power rails M11 and M12 of the hybrid cell HCL may be smaller than the width W of those of the standard cell SCL. In an exemplary embodiment of the present inventive concept, as illustrated in FIG. 5, both the width of the first power rail M11 and the width of the second power rail M12 may be reduced in comparison with the standard cell SCL of FIG. 3. In an exemplary embodiment of the present inventive concept, only one of the width of the first power rail M11 and the width of the second power rail M12 may be reduced in comparison with the standard cell SCL of FIG. 3. By reducing the widths of the power rails, the design margin of the wirings M13~M18 between the power rails M11 and M12 may be increased.

As illustrated in FIG. 5, the fourth wiring M14 may have four pin points, the fifth wiring M15 may have three pin points, the sixth wiring M16 may have four pin points, the seventh wiring M17 may have six pin points and the eighth wiring M18 may have three pin points. Referring to FIGS. 3 and 5, the sixth wiring M16 and the seventh wiring M17 of the hybrid cell HCL may be elongated in comparison with the standard cell SCL. This may be due to the increase of the design margin through the reduction of the power rail width. As a result, the hybrid cell HCL may have higher routability than the standard cell SCL while maintaining the size of the cell.

Conventionally an integrated circuit has been developed using cells of the same cell architecture. However, the pin points or the pin targets may become deficient as the integration degree of the integrated circuit increases. To reduce the deficiency of the pin points, a space margin between the cells or the size of the cell may be increased. However, the entire occupation area of the integrated circuit is increased. The hybrid cell according to an exemplary embodiment of the present inventive concept may increase the number of the pin points without increasing the size of the cell. Using the hybrid cell with the increased pin points, routability may be increased and the occupation area of the integrated circuit may be reduced.

Figure 6:
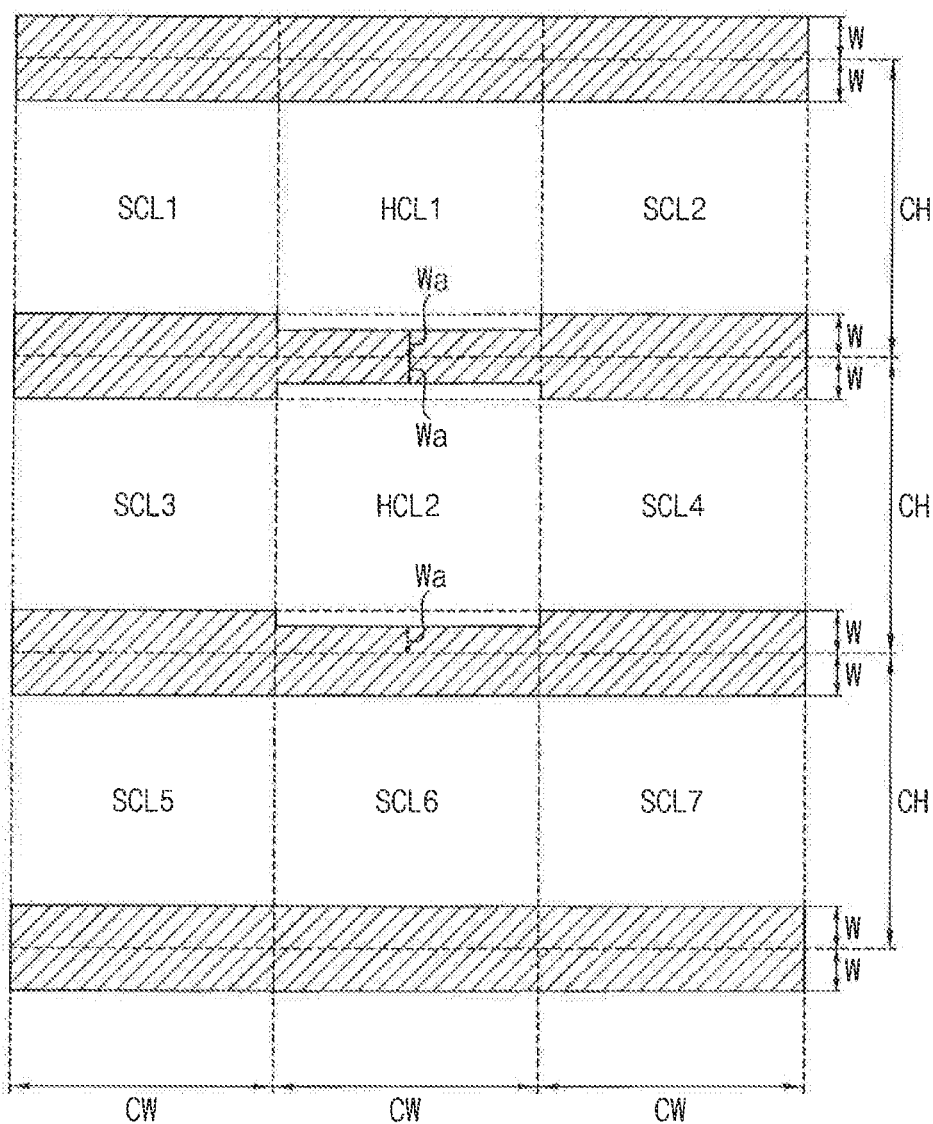
FIG. 6 is a diagram illustrating a layout of an integrated circuit according to an exemplary embodiment of the present inventive concept.

FIG. 6 is a diagram illustrating a layout of an integrated circuit according to an exemplary embodiment of the present inventive concept.

Referring to FIG. 6, an integrated circuit 2000 may include a plurality of standard cells and at least one hybrid cell. For example, the integrated circuit 2000 may include first through seventh standard cells SCL1~SCL7 and first and second hybrid cells HCL1 and HCL2. All of the standard cells SCL1~SCL7 and the hybrid cells HCL1 and HCL2 may have the same cell width CW and the same cell height CH.

As illustrated in FIG. 6, power rails extended in the row direction may be disposed at the cell boundary portions along the column direction. As described above, the width Wa of the power rails of the hybrid cells HCL1 and HCL2 may be smaller than the width W of the power rails of the standard cells SCL1~SCL7. For example, a width of the upper power rail of a hybrid cell is smaller than a width of an upper power rail of the corresponding standard cell or a width of a lower power rail of the hybrid cell is smaller than a width of a lower power rail of the corresponding standard cell.

FIG. 6 illustrates the first hybrid cell HCL1 and the second hybrid cell HCL2 having the reduced power rail width, as example. In the first hybrid cell HCL1, the upper power rail has the width W equal to that of the standard cells and the lower power rail has the reduced width Wa. In the second hybrid cell HCL2, both of the upper power rail and the lower power rail have the reduced width Wa in comparison with the standard cells. It is to be understood, however, that the upper power rail may have the reduced width Wa and the lower power rail may have the width W equal to that of the standard cells in some hybrid cells.

The upper power rail or the lower power rail of a hybrid cell may be asymmetrically divided by a cell boundary. For example, as illustrated in FIG. 6, the width of the power rail at the boundary portion between the second hybrid cell HCL2 and the sixth standard cell SCL6, in other words, the lower power rail of the second hybrid cell HCL2, may not be divided equally by the cell boundary line. In other words, the width Wa of the lower power rail of the second hybrid cell HCL2 may be smaller than the width W of the upper power rail of the sixth standard cell SCL6. Thus, the real width (e.g., W+Wa) of the physical power rail shared by the second hybrid cell HCL2 and the sixth standard cell SCL6 is not be equally divided by the cell boundary line as illustrated in FIG. 6.

As such, the integrated circuit and the method of designing the integrated circuit according to exemplary embodiments of the present inventive concept may reduce an occupation area of the integrated circuit by using the modified cell that has the same function as the standard cell and increased routability compared with the standard cell.

The above-described embodiments of the present inventive concept correspond to a hybrid cell having a power rail with a reduced width in comparison with a standard cell. In an exemplary embodiment of the present inventive concept, the hybrid cell of the reduced power rail width may be replaced with a hybrid cell having an increased power rail width in comparison with the standard cell. As pertains to power integrity, the hybrid cell of the increased power rail width may replace its corresponding standard cell.

Figure 7:
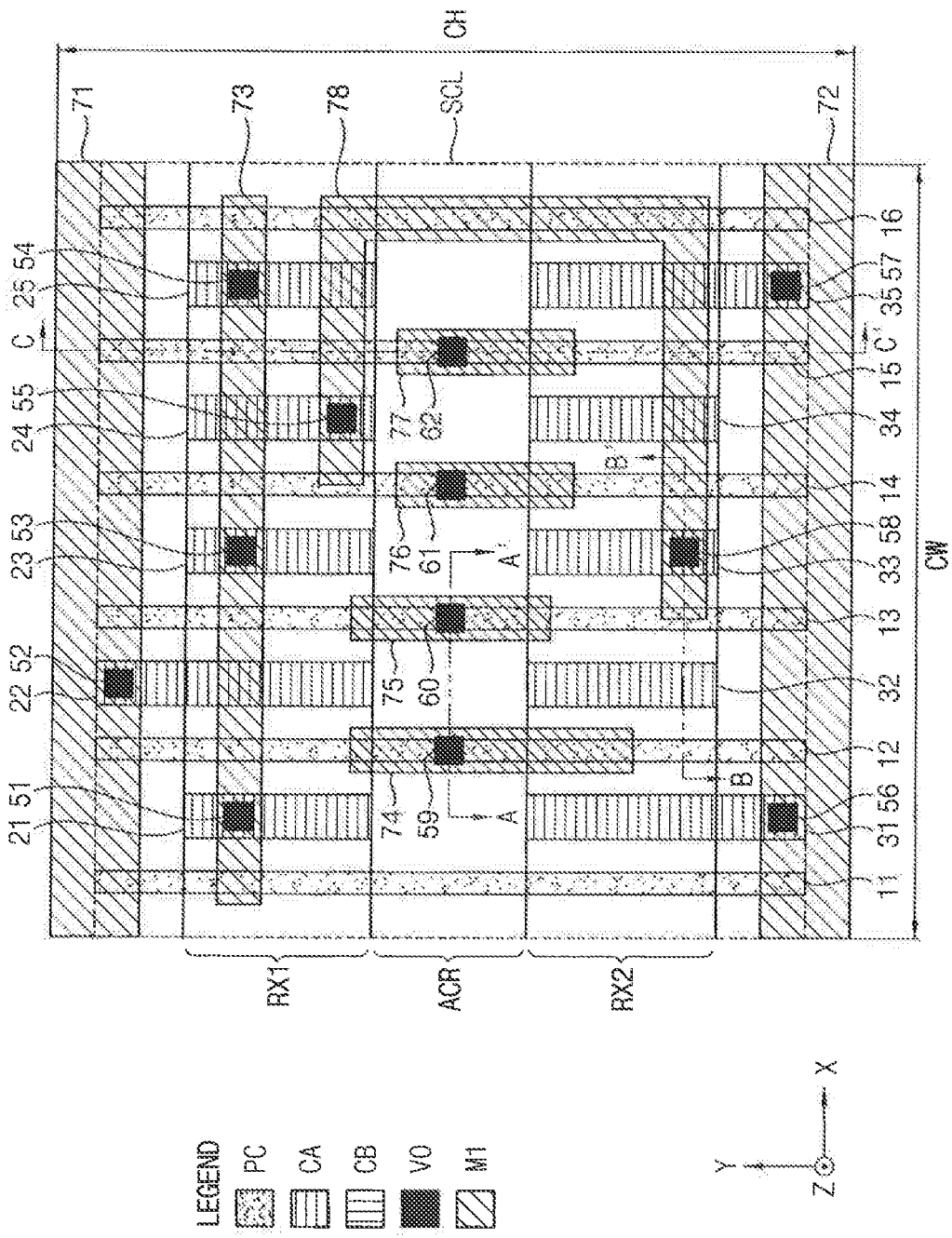
FIG. 7 is a diagram illustrating a layout of an example standard cell.
Figure 8A:
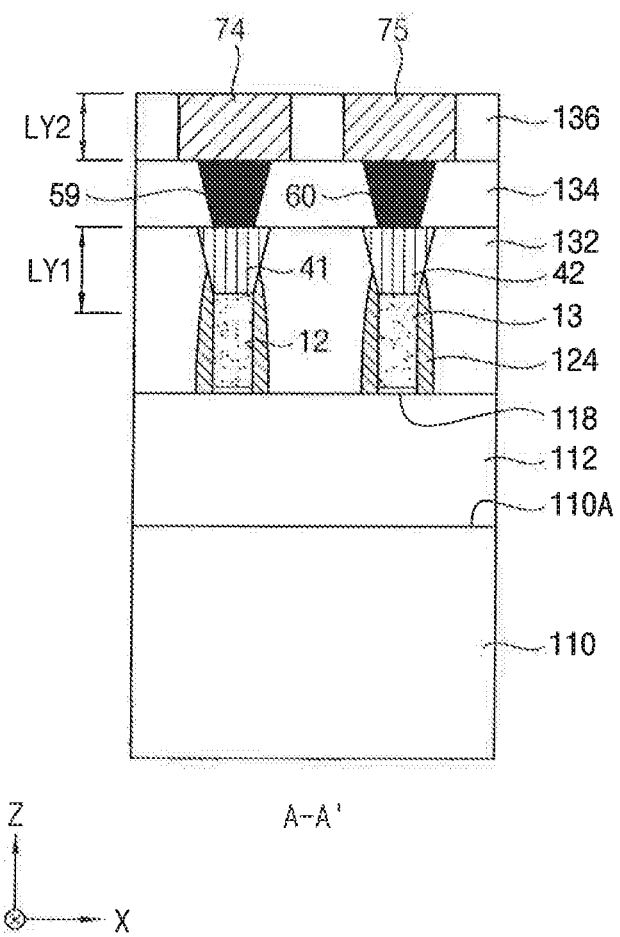
FIGS. 8A, 8B and 8C are cross-sectional views of a standard cell that may have the same layout as the standard cell of FIG. 7.
Figure 8B:
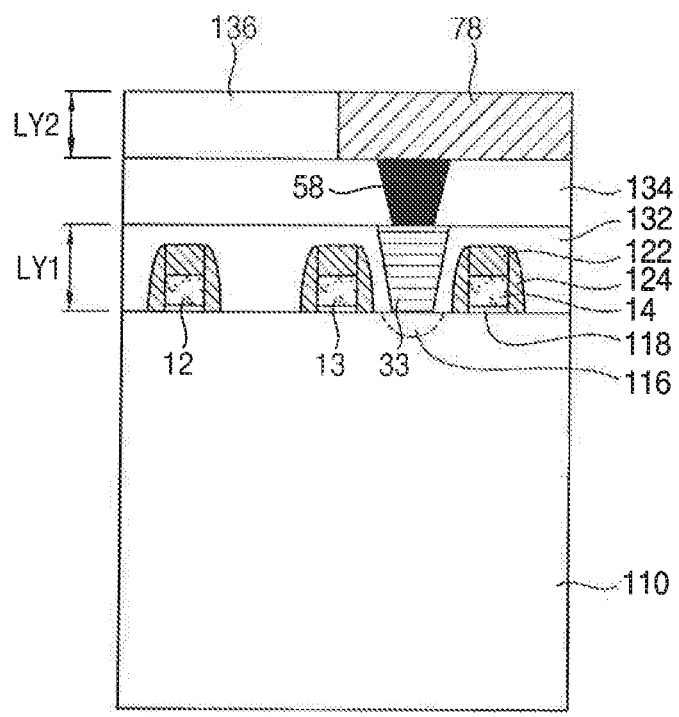
Figure 8C:
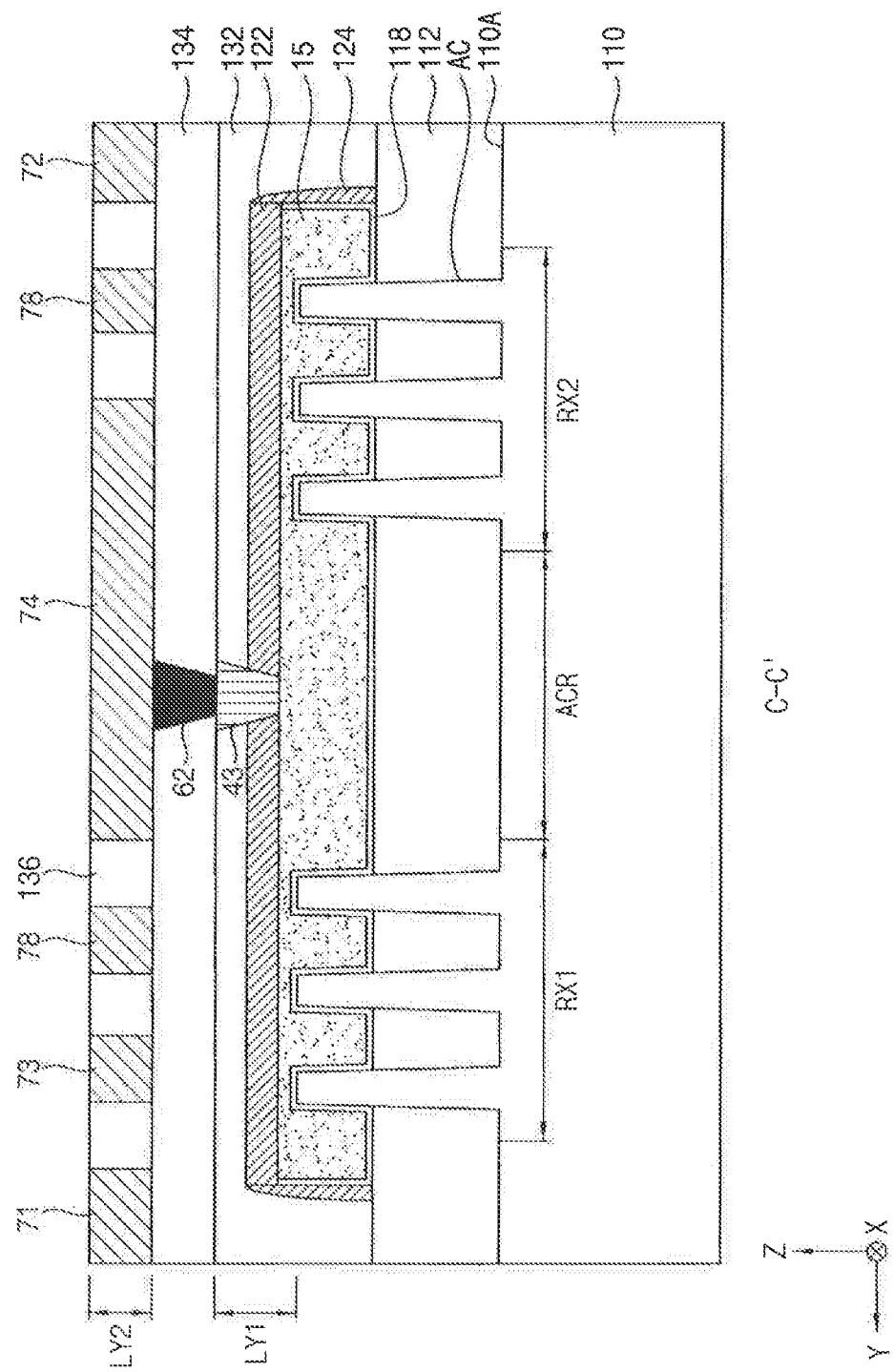

FIG. 7 is a diagram illustrating a layout of an example standard cell, and FIGS. 8A, 8B and 8C are cross-sectional views of a standard cell that may have the same layout as the standard cell of FIG. 7.

FIGS. 8A, 8B and 8C illustrate a portion of the standard cell SCL that includes a fin field effect transistor (FinFET). FIG. 8A is a cross-sectional view of the standard cell SCL of FIG. 7 cut along a line A-A'. FIG. 8B is a cross-sectional view of the standard cell SCL of FIG. 7 cut along a line B-B'. FIG. 8C is a cross-sectional view of the standard cell SCL of FIG. 7 cut along a line C-C'.

Referring to FIGS. 7, 8A, 8B and 8C, the standard cell SCL may be formed at a substrate 110 having an upper surface 110A that extends in a horizontal direction, in other words, the first direction X and the second direction Y.

In an exemplary embodiment of the present inventive concept, the substrate 110 may include a semiconductor such as Si or Ge or a compound semiconductor such as SiGe, SiC, GaAs, InAs, or InP. In an exemplary embodiment of the present inventive concept, the substrate 110 may have a silicon on insulator (SOI) structure. The substrate 10 may include a conductive area such as an impurity-doped well or an impurity-doped structure.

The standard cell SCL includes a first device area RX1, a second device area RX2 and an active cut area ACR separating the first and second device areas RX1 and RX2. In each of the first and second device areas RX1 and RX2, a plurality of fin-type active areas AC protruded from the substrate 110 may be formed.

The plurality of active areas AC are extended in parallel to one another in the first direction X. A device isolation layer 112 is formed between the plurality of active areas AC on the substrate 110. The plurality of active areas AC protrude from the device isolation layer 112 in the form of fins.

A plurality of gate insulation layers 118 and a plurality of gate lines PC 11, 12, 13, 14, 15 and 16 are formed on the substrate 110. The gate lines PC 11, 12, 13, 14, 15 and 16 are extended in the second direction Y crossing the plurality of active areas AC. The plurality of gate insulation layers 118 and the plurality of gate lines PC 11, 12, 13, 14, 15 and 16 are extended while covering an upper surface and two sidewalls of each of the active areas AC and an upper surface of the device isolation layer 112. A plurality of metal oxide semiconductor (MOS) transistors are formed along the plurality of gate lines PC 11, 12, 13, 14, 15 and 16. The MOS transistors may have a three-dimensional structure in which channels are formed in the upper surface and the two sidewalls of the active areas AC.

The gate insulation layers 118 may be formed of a silicon oxide layer, a high-k dielectric layer, or a combination of these. The plurality of gate lines PC 11, 12, 13, 14, 15 and 16 are extended on the gate insulation layers 118 across the plurality of active areas AC while covering the upper surface and the two side surfaces of each of the active areas AC.

The gate lines PC 11, 12, 13, 14, 15 and 16 may have a structure in which a metal nitride layer, a metal layer, a conductive capping layer, and a gap-fill metal layer are sequentially stacked. The metal nitride layer and the metal layer may include Ti, Ta, W, Ru, Nb, Mo, or Hf. The metal layer and the metal nitride layer may be formed, for example, by using an atomic layer deposition (ALD) method, a metal organic ALD method, or a metal organic chemical vapor deposition (MOCVD) method. The conductive capping layer may function as a protection layer that prevents oxidization of a surface of the metal layer. In addition, the conductive capping layer may function as an adhesive layer (e.g., a wetting layer) that facilitates deposition of another conductive layer on the metal layer. The conductive capping layer may be formed of a metal nitride such as a TiN or TaN or a combination of these, but is not limited thereto. The gap-fill metal layer may fill spaces between the active areas AC and extend on the conductive capping layer. The gap-fill metal layer may be formed of a W (e.g., tungsten) layer. The gap-fill metal layer may be formed, for example, by using an ALD method, a CVD method, or a physical vapor deposition (PVD) method.

A plurality of conductive contacts CA and CB are formed at a first layer LY1 on the active areas AC. The plurality of conductive contacts CA and CB include a plurality of first contacts CA 21, 22, 23, 24, 25, 31, 32, 33, 34 and 35 connected to a source/drain area 116 of the active areas AC and a plurality of second contacts CB 41, 42 and 43 connected to the gate lines 11, 12, 13, 14, 15 and 16.

The plurality of conductive contacts CA and CB may be insulated from each other by a first interlayer insulation layer 132 that covers the active areas AC and the gate lines GL. The plurality of conductive contacts CA and CB may have an upper surface that is at the same level as an upper surface of the first interlayer insulation layer 132. The first interlayer insulation layer 132 may be formed of a silicon oxide layer, but is not limited thereto.

A second interlayer insulation layer 134 and a plurality of lower via contacts V0 51, 52, 53, 54, 55, 56, 57, 58, 59, 60, 61 and 62 that pass through the second interlayer insulation layer 134 are formed on the first interlayer insulation layer 132. The second interlayer insulation layer 134 may be formed of a silicon oxide layer, but is not limited thereto.

A plurality of wirings M1 71, 72, 73, 74, 75, 76, 77 and 78 that are extended in the horizontal direction at a second layer LY2 which is higher than the first layer LY1 are formed on the second interlayer insulation layer 134.

Each of the wirings M1 may be connected to one contact of the plurality of conductive contacts CA and CB via one lower via contact V0 of the plurality of lower via contacts V0. Each contact of the plurality of lower via contacts V0 may be connected to one of the plurality of conductive contacts CA and CB by passing through the second interlayer insulation layer 134. The plurality of lower via contacts V0 may be insulated from one another by the second interlayer insulation layer 134.

The wirings 71~78 may include an internal connection wiring that electrically connects a plurality of areas in the standard cell SCL. For example, the internal connection wiring 78 may electrically connect the active area AC in the first device area RX1 and the active area AC in the second device area RX2 through the lower via contacts 55 and 58 and the first contacts 24 and 33.

The first power rail 71 may be connected to the active area AC which is in the first device area RX1, and the second power rail 72 may be connected to the active area AC which is in the second device area RX2. One of the first and second power rails 71 and 72 may be a wiring for supplying a power supply voltage and the other of the first and second power rails 71 and 72 may be a wiring for supplying a ground voltage.

The first power rail 71 and the second power rail 72 may be extended in the first direction X in parallel to each other on the second layer LY2. In an exemplary embodiments of the present inventive concept the power rails 71 and 72 may be formed at the same time with the other wirings 73~78. The wirings M1 may be formed to pass through a third interlayer insulation layer 136. The third interlayer insulation layer 136 may insulate the wirings M1 from one another.

A height CH of the standard cell SCL may be defined by the distance along the second direction Y between the first power rail 71 and the second power rail 72. In addition, a width CW of the standard cell SCL may be defined along the first direction X that is parallel to the power rails 71 and 72.

The wirings M may have to meet limitations due to a minimum spacing rule. For example, the wirings M may have to meet limitations according to a "tip-to-side" restriction as will be described below with reference to FIG. 21A and a "corner rounding" restriction as will be described below with reference to FIG. 21B. The size and disposition of the wirings M may be limited by such restrictions.

The lower via contacts V0 and the wirings M1 may have a stacked structure of a barrier layer and a wiring conductive layer. The barrier layer may be formed, for example, of TiN, TaN, or a combination of these. The wiring conductive layer may be formed, for example, of W, Cu, an alloy thereof, or a combination thereof. A CVD method, an ALD method, or an electroplating method may be used to form the wirings M1 and the lower via contacts V0.

Figure 9A:
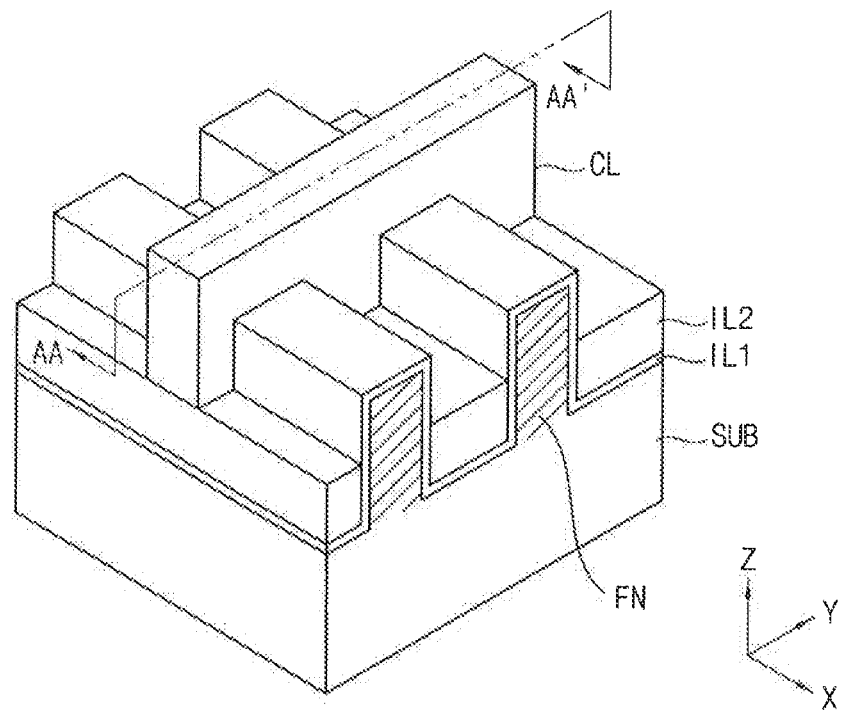
FIGS. 9A and 9B are diagrams illustrating an example of a fin transistor.
Figure 9B:
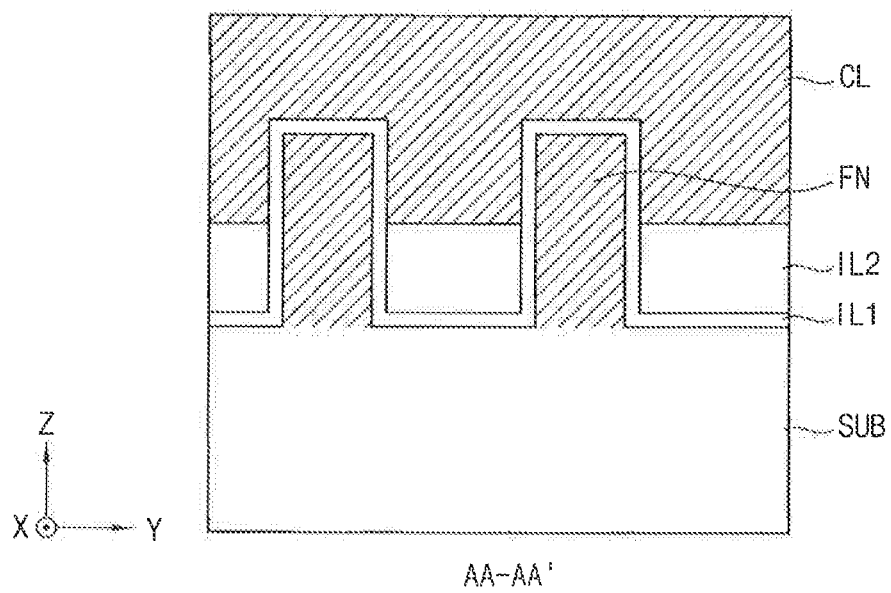

FIGS. 9A and 9B are diagrams illustrating an example of a fin transistor.

FIG. 9A is a perspective view of an example of a fin transistor having the layout of FIG. 7 and FIG. 9B is a cross-sectional view taken along line AA-AA' of FIG. 9A.

Referring to FIGS. 9A and 9B, the fin transistor may be a bulk-type fin transistor and may include a substrate SUB, a first insulating layer IL1, a second insulating layer IL2, fins FN, and a conductive line CL (hereinafter, referred to as a gate electrode).

The substrate SUB may be a semiconductor substrate. For example, the semiconductor substrate may include silicon, silicon-on-insulator, silicon-on-sapphire, germanium, or gallium arsenide. The substrate SUB may be a P-type substrate and may be used as an active region AR1. The fins FN may be connected to the substrate SUB. In exemplary embodiments of the present inventive concept, the fins FN may be n+-doped or p+-doped active regions that vertically protrude from the substrate SUB.

The first and second insulating layers IL1 and IL2 may include an insulating material. For example, the insulating material may include an oxide film, a nitride film, or an oxynitride film. The first insulating layer IL1 may be disposed on the fins FN. The first insulating layer IL1 may be disposed between the fins FN and the gate electrode CL and may be used as a gate insulating film. The second insulating layer IL2 may be disposed in spaces between the fins FN and have a predetermined height. The second insulating layer IL2 may be disposed between the fins FN and may be used as an element isolation film.

The gate electrode CL may be disposed on the first and second insulating layers IL1 and IL2. Accordingly, the gate electrode CL may have a structure that surrounds the fins FN and the first and second insulating layers IL1 and IL2. In other words, the fins FN may have structures that are disposed in the gate electrode CL. The gate electrode CL may include metal materials such as tungsten (W) and tantalum (Ta), nitrides thereof, silicides thereof, or doped polysilicon. The gate electrode CL may be formed by a deposition process.

Figure 10A:
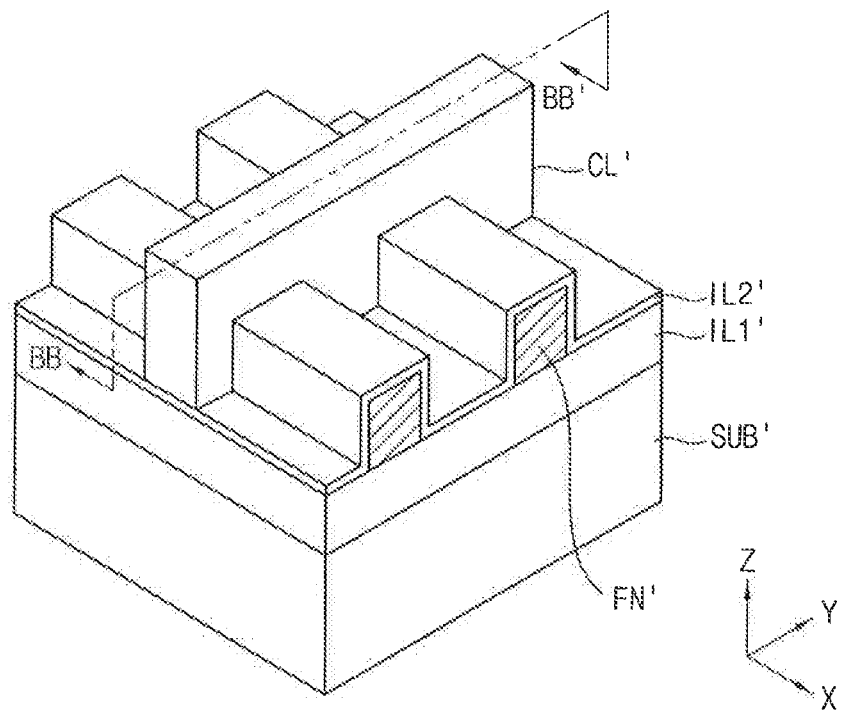
FIGS. 10A and 10B are diagrams illustrating an example of a fin transistor.
Figure 10B:
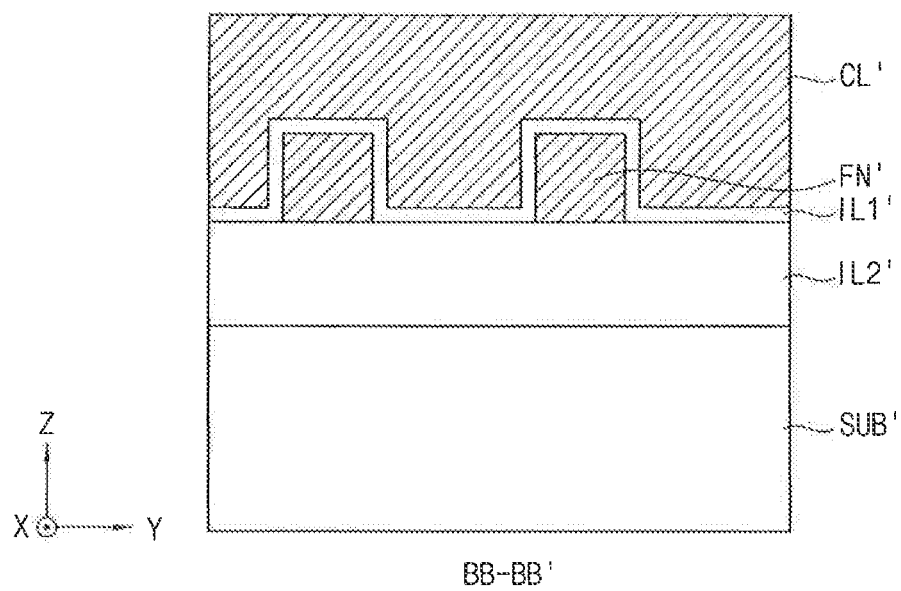

FIGS. 10A and 10B are diagrams illustrating an example of a fin transistor.

FIG. 10A is a perspective view of an example of a fin transistor having the layout of FIG. 7 and FIG. 10B is a cross-sectional view taken along line BB-BB' of FIG. 10A.

Referring to FIGS. 10A and 10B, the fin transistor may be an SOI-type fin transistor, and may include a substrate SUB', a first insulating layer IL1', a second insulating layer IL2', fins FN', and a conductive line CL'(hereinafter, referred to as a gate electrode). Because the fin transistor of FIGS. 10A and 10B is a modification of the fin transistor of FIGS. 9A and 9B, repeated descriptions are omitted.

The first insulating layer IL1' may be disposed on the substrate SUB'. The second insulating layer IL2' may be disposed between the fins FN' and the gate electrode CL' and may be used as a gate insulating film. The fins FN' may be a semiconductor material, for example, silicon or doped silicon.

The gate electrode CL' may be disposed on the second insulating layer IL2'. Accordingly, the gate electrode CL' may have a structure that surrounds the fins FN' and the second insulating layer IL2'. In other words, the fins FN' may have structures that are disposed in the gate electrode CL'.

Figure 11:
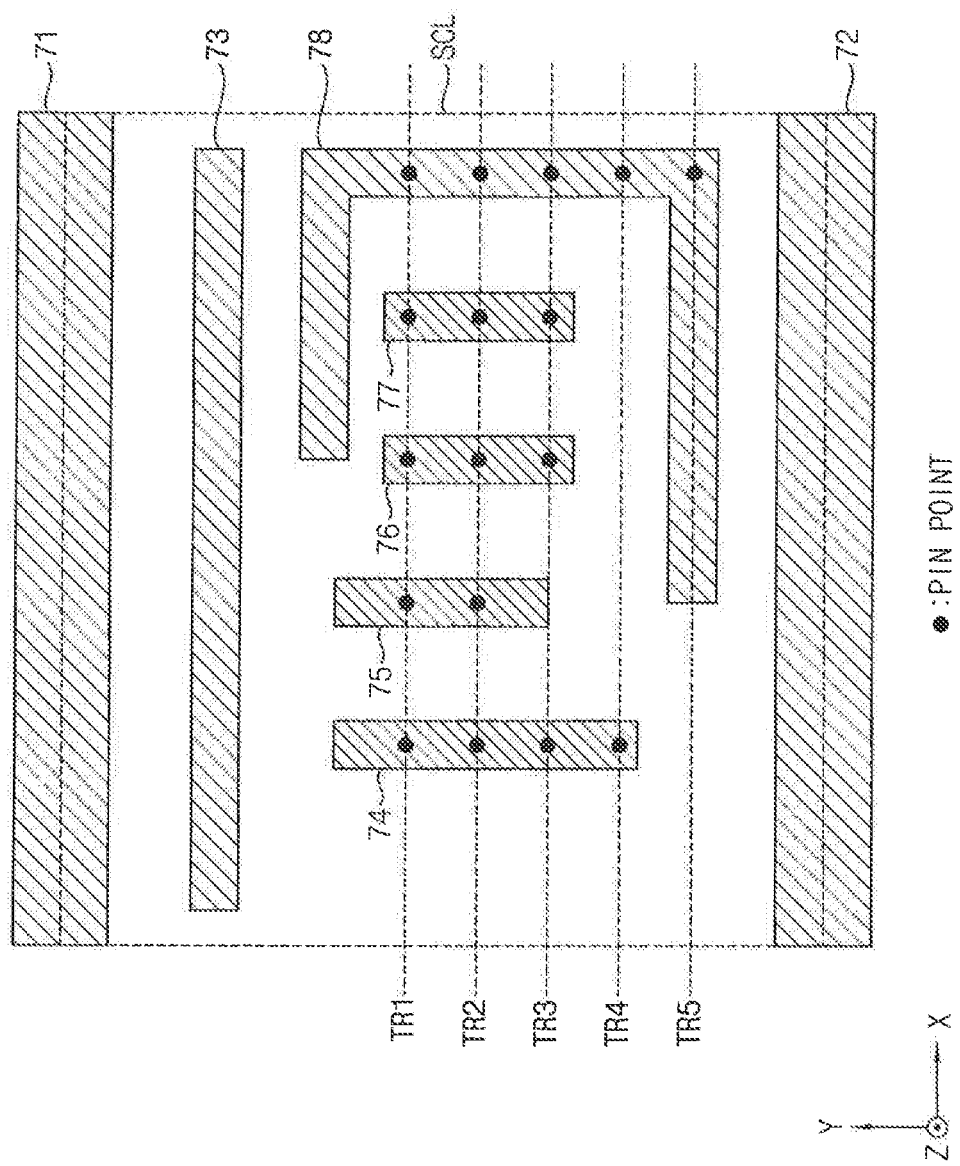
FIG. 11 is a diagram illustrating pin points of the standard cell of FIG. 7.

FIG. 11 is a diagram illustrating pin points of the standard cell of FIG. 7.

For convenience, only the wirings, for example, first through eighth wirings 71~78 among the elements in FIG. 7 are illustrated in FIG. 11. In addition, the routing grids or the routing tracts, for example, first through fifth tracts TR1~TR5, which are formed over the standard cell SCL, are illustrated together in FIG. 11. Although FIG. 11 illustrates the row tracts TR1~TR5 that are extended in the first direction X and arranged in the second direction Y, column tracts that are extended in the second direction Y and arranged in the first direction X may be disposed over the standard cell SCL. In exemplary embodiments of the present inventive concept, both of the row tracts and the column tracts may be disposed using two wiring layers.

The cross points of the wirings 71~78 of the standard cell SCL and the routing tracts TR1~TR5 may correspond to pin points for signal output and signal input. A pin point may indicate a position that may electrically connect one of the wirings 71~78 of the standard cell SCL to one of the routing tracts TR1~TR5 through a vertical contact such as a via contact.

Distances between the wirings 71~78 and locations of the pinpoints may be restricted due to electromagnetic interference between the wirings 71~78, variations of manufacturing processes, etc. As illustrated in FIG. 11, the fourth wiring 74 may have four pin points, the fifth wiring 75 may have two pin points, the sixth wiring 76 may have three pin points, the seventh wiring 77 may have three pin points and the eighth wiring 78 may have five pin points.

Hereinafter, referring to FIGS. 12 through 20, a padding cell according to exemplary embodiments of the present inventive concept is described as an example of a modified cell having the same function as a standard cell and having a higher routability than the standard cell.

Figure 12:
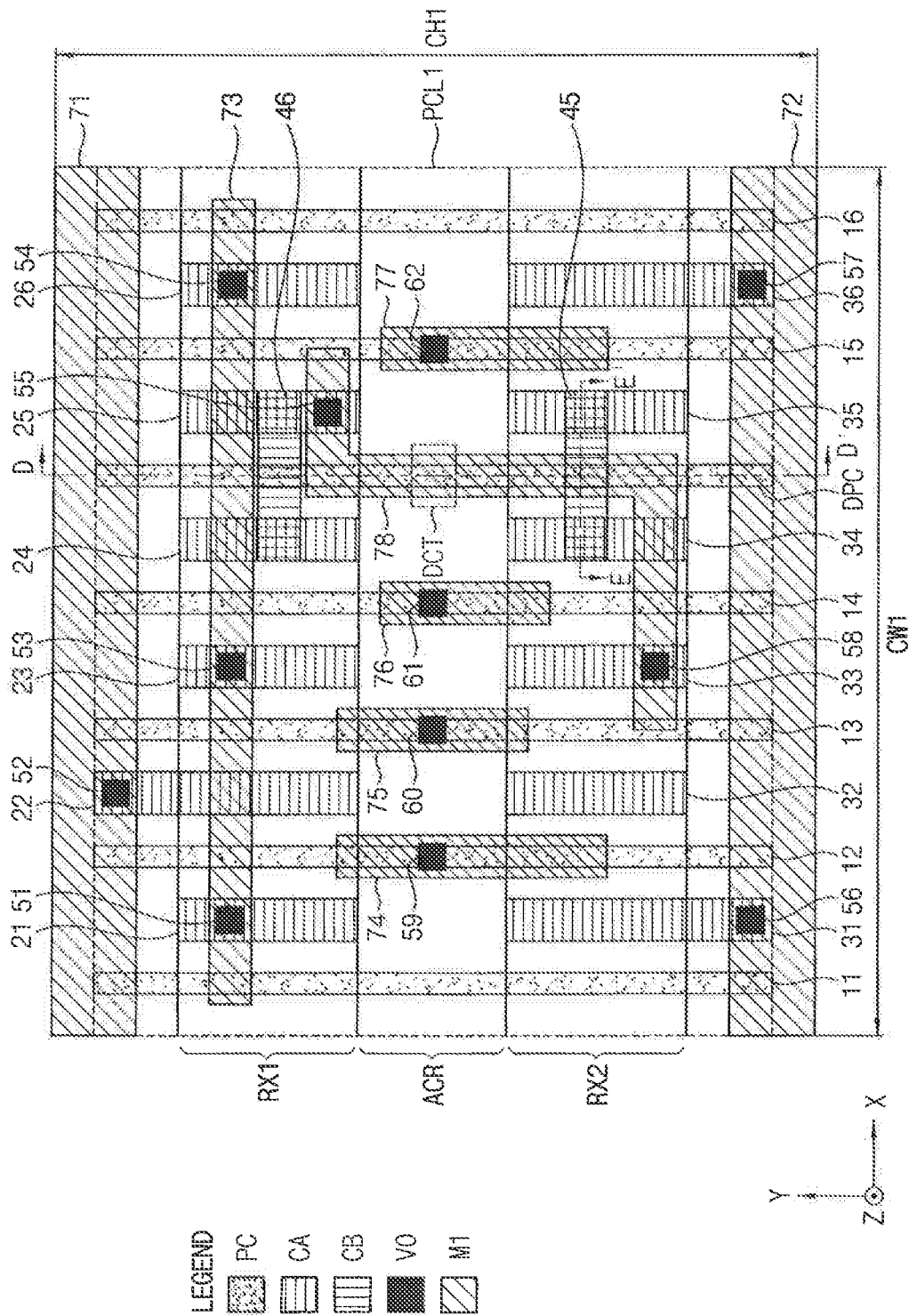
FIG. 12 is a diagram illustrating a layout of a padding cell according to an exemplary embodiment of the present inventive concept.
Figure 13A:
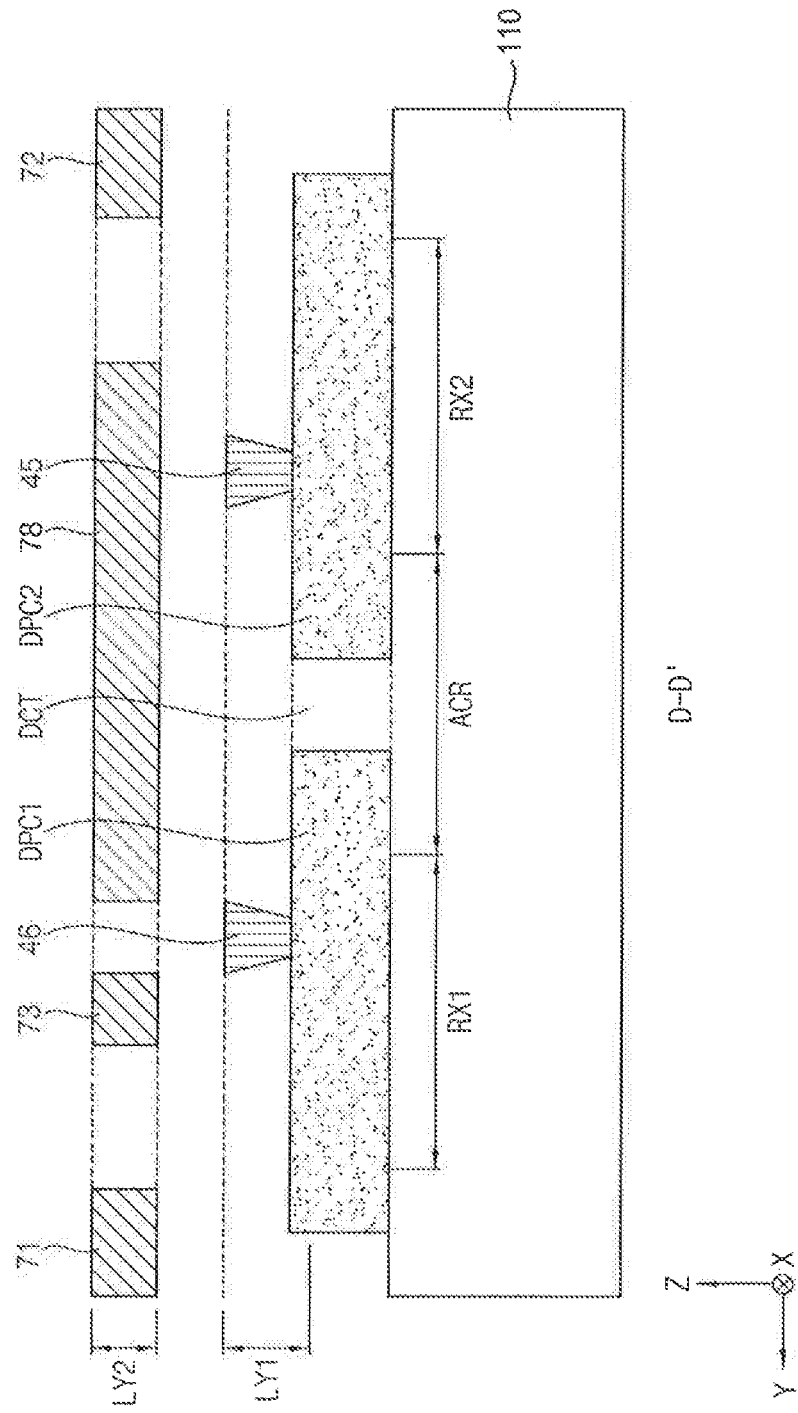
FIGS. 13A and 13B are cross-sectional views of a padding cell that may have the same layout as the padding cell of FIG. 12, according to an exemplary embodiment of the present inventive concept.
Figure 13B:
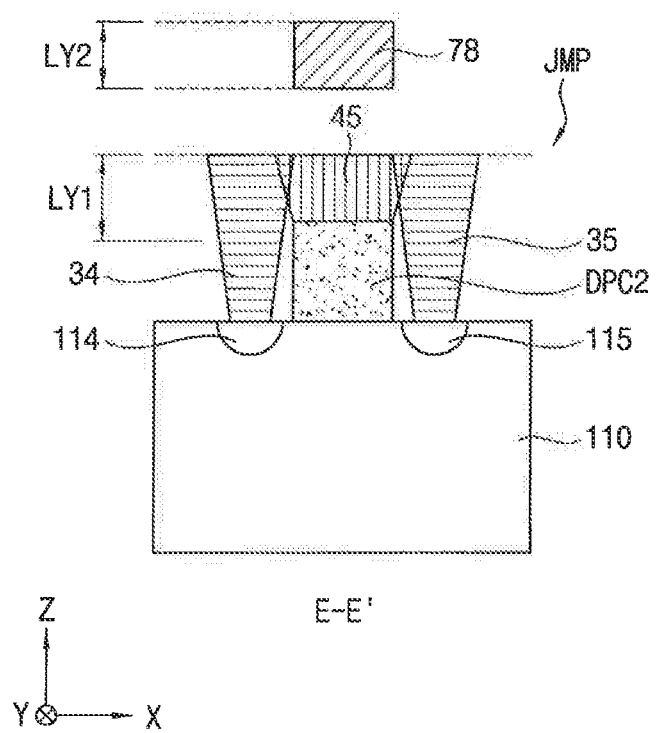

FIG. 12 is a diagram illustrating a layout of a padding cell according to an exemplary embodiment of the present inventive concept, and FIGS. 13A and 13B are cross-sectional views of a padding cell that may have the same layout as the padding cell of FIG. 12, according to an exemplary embodiment of the present inventive concept.

FIG. 13A is a cross-sectional view of the padding cell PCL1 cut along a line D-D' and FIG. 13B is a cross-sectional view of the padding cell PCL1 cut along a line E-E'. The padding cell PCL1 of FIGS. 12, 13A and 13B may be the modified cell corresponding to the standard cell SCL as described with reference to FIGS. 7, 8A, 8B and 8C. The padding cell PCL1 is similar to the standard cell SCL of FIG. 7, and thus, repeated descriptions may be omitted. The fin shape, gate insulation layers, interlayer insulation layers, etc. as described above are omitted in FIGS. 12, 13A and 13B.

Referring to FIGS. 12, 13A and 13B, the padding cell PCL1 may be formed at a substrate 110 having an upper surface that extends in a horizontal direction, in other words, the first direction X and the second direction Y.

The padding cell PCL1 includes a first device area RX1, a second device area RX2 and an active cut area ACR separating the first and second device areas RX1 and RX2.

A plurality of gate insulation layers, a plurality of gate lines PC 11, 12, 13, 14, 15 and 16 and a dummy gate line DPC are formed on the substrate 110. The gates lines PC 11, 12, 13, 14, 15 and 16 and the dummy gate line DPC are extended in the second direction Y crossing the plurality of active areas AC. By adding the dummy gate line DPC, the cell width CW1 of the padding cell PCL1 may be greater than the cell width CW of the corresponding standard cell SCL. The cell height CH1 of the padding cell PCL1 may be equal to the cell height CH of the standard cell SCL.

The plurality of gate insulation layers and the plurality of gate lines PC 11, 12, 13, 14, 15 and 16 are extended while covering an upper surface and two sidewalls of each of the active areas AC and an upper surface of the device isolation layer 112. A plurality of MOS transistors are formed along the plurality of gate lines PC 11, 12, 13, 14, 15 and 16.

A plurality of conductive contacts CA and CB are formed at a first layer LY1 over the substrate 110. The plurality of conductive contacts CA and CB include a plurality of first contacts CA 21, 22, 23, 24, 25, 26, 31, 32, 33, 34, 35 and 36 connected to source/drain areas 114 and 115 of the active areas AC and a plurality of second contacts CB 45 and 46 connected to the gate lines PC 11, 12, 13, 14, 15 and 16 and the dummy gate line DPC.

A plurality of wirings M1 71, 72, 73, 74, 75, 76, 77 and 78 that are extended in the horizontal direction are formed at a second layer LY2 which is higher than the first layer LY1. Each of the wirings M1 may be connected to one contact of the plurality of conductive contacts CA and CB via one lower via contact V0 of a plurality of lower via contacts V0 51, 52, 53, 54, 55, 56, 57, 58, 59, 60, 61, and 62 formed between the first layer LY1 and the second layer LY2. Each contact of the plurality of lower via contacts V0 may be connected to one of the plurality of conductive contacts CA and CB by passing through an interlayer insulation layer.

The wirings 71~78 may include an internal connection wiring that electrically connects a plurality of areas in the padding cell PCL1. For example, the internal connection wiring 78 may electrically connect the active area AC in the first device area RX1 and the active area AC in the second device area RX2 through the lower via contacts 55 and 58 and the first contacts 24 and 33. As illustrated in FIG. 12, the internal connection wiring 78 may include a parallel wiring segment that is formed over the dummy gate line DPC along the second direction Y in parallel with the dummy gate line DPC.

As illustrated in FIG. 13A, the dummy gate line DPC may include a first gate segment DPC1 and a second gate segment DPC2 that are separated by a gate cut region DCT. The first gate segment DPC1 may be electrically connected to the active regions AC at both sides of the first gate segment DPC1 through a first jumper structure and the second gate segment DPC2 may be electrically connected to the active regions AC at both sides of the second gate segment DPC2 through a second jumper structure.

The first jumper structure and the second jumper structure may have substantially the same shape. The jumper structure may include first contacts formed on the active regions AC at both sides of the dummy gate line DPC and a second contact formed on the dummy gate line DPC to electrically connect the active regions AC and the dummy gate line DPC. FIG. 13B illustrates an example of the second jumper structure. As illustrated in FIG. 13B, in the jumper structure JMP, the first contacts 34 and 35 formed on the active regions 114 and 115 at both sides of the second gate segment DPC2 of the dummy gate line DPC and the second contact 45 formed on the second gate segment DPC2 are fused, for example, inseparably. Using the second jumper structure JMP, the second gate segment DPC2 of the dummy gate line DPC may be electrically connected to the active regions 114 and 115.

Figure 14:
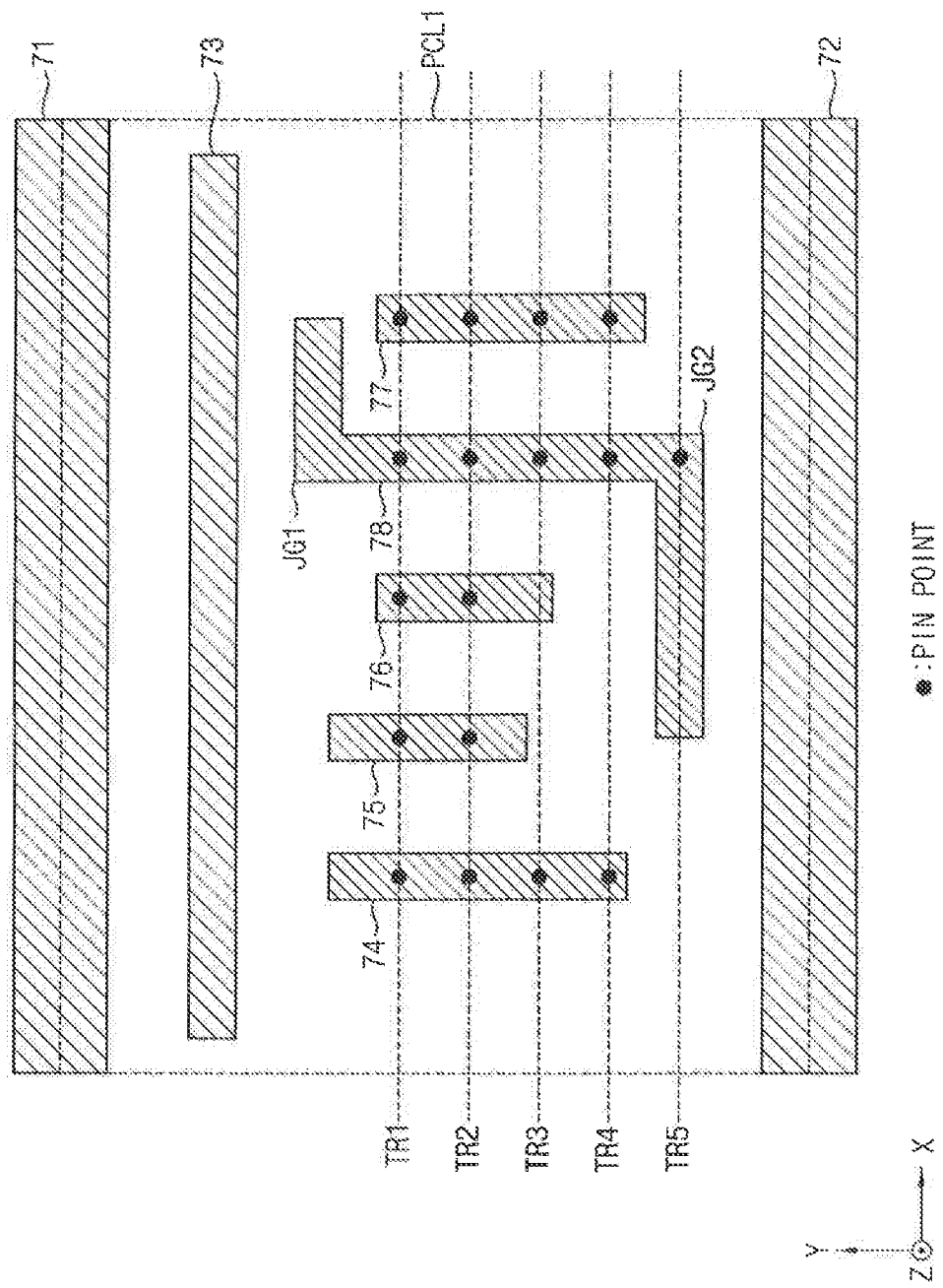
FIG. 14 is a diagram illustrating pin points of the padding cell of FIG. 12, according to an exemplary embodiment of the present inventive concept.

FIG. 14 is a diagram illustrating pin points of the padding cell of FIG. 12, according to an exemplary embodiment of the present inventive concept.

For convenience, only the wirings, for example, first through eighth wirings 71~78 among the elements in FIG. 12 are illustrated in FIG. 14. In addition, the routing grids or the routing tracts, for example, first through fifth tracts TR1~TR5, which are formed over the padding cell PCL1, are illustrated together in FIG. 14.

As illustrated in FIG. 14, the fourth wiring 74 may have four pin points, the fifth wiring 75 may have two pin points, the sixth wiring 76 may have two pin points, the seventh wiring 77 may have four pin points and the eighth wiring 78 may have five pin points.

Comparing FIGS. 11 and 14, the number of the pin points of the padding cell PCL1 may be increased in comparison with its corresponding standard cell SCL, using the dummy gate line DPC and the internal connection wiring 78. However the internal connection wiring 78 has the two jogging portions JG1 and JG2, and thus, the size and the disposition of other wirings may be limited and the routability may be degraded. Here a jogging portion is a portion of a wiring at which an extending direction thereof is converted at a right angle.

Figure 15:
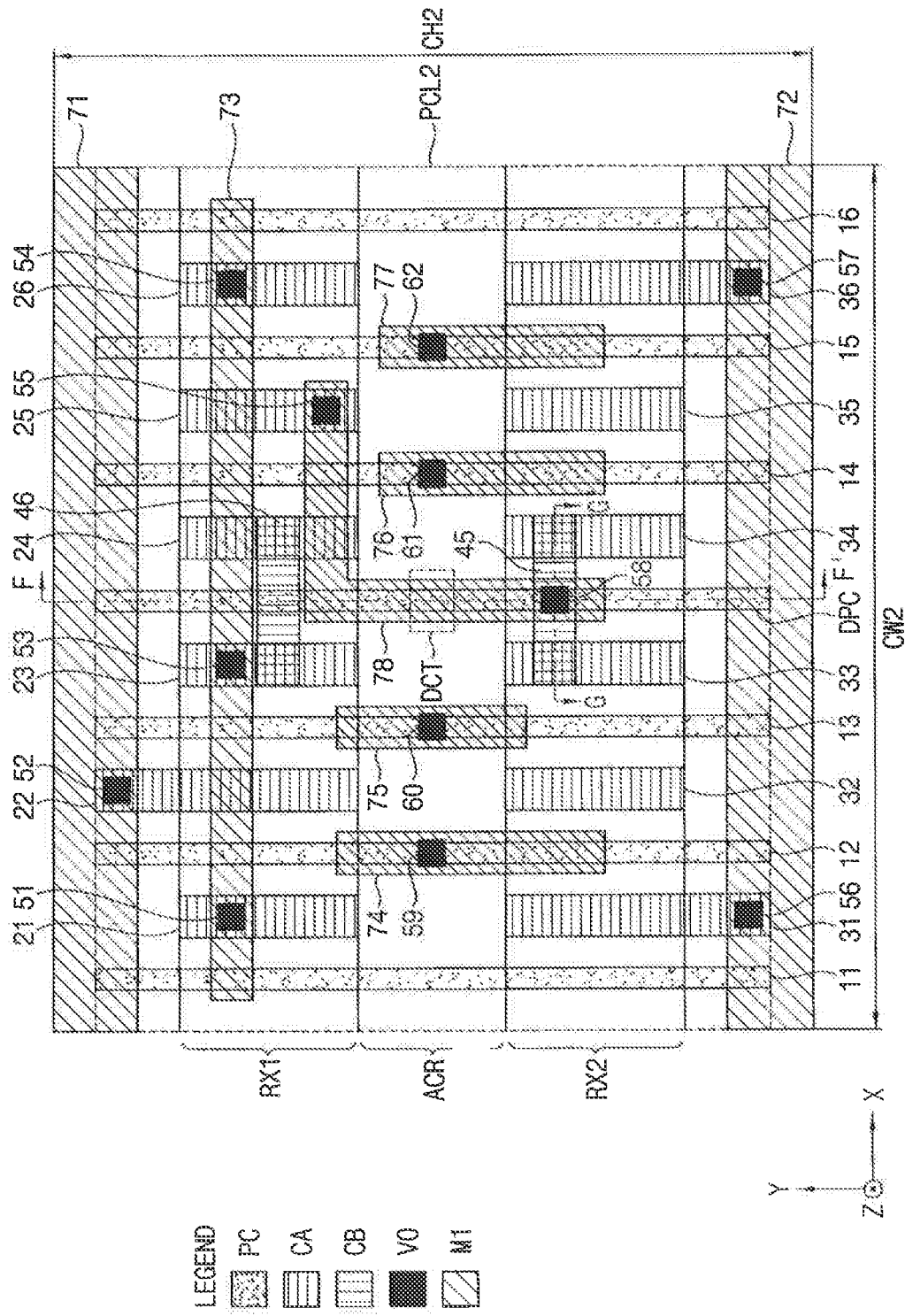
FIG. 15 is a diagram illustrating a layout of a padding cell according to an exemplary embodiment of the present inventive concept.
Figure 16A:
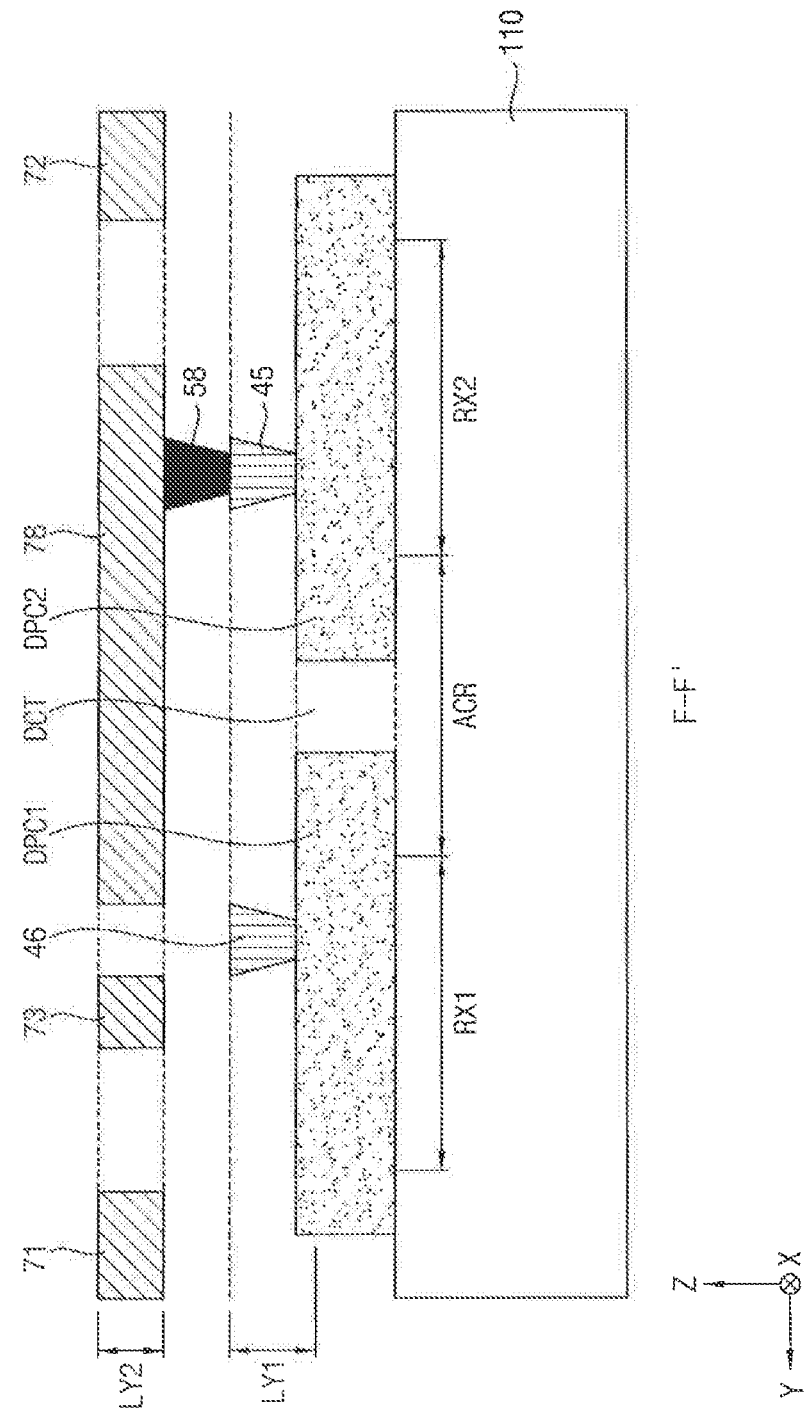
FIGS. 16A and 16B are cross-sectional views of a padding cell that may have the same layout as the padding cell of FIG. 15, according to an exemplary embodiment of the present inventive concept.
Figure 16B:
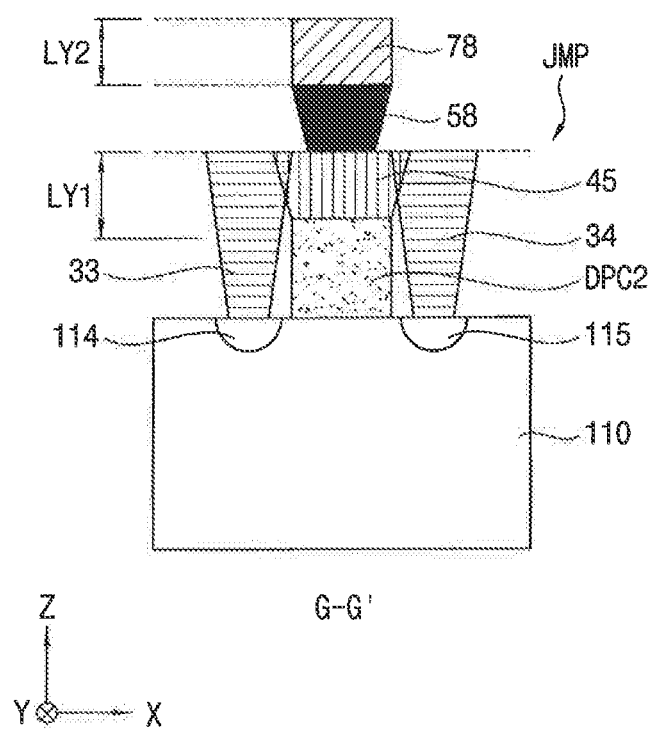

FIG. 15 is a diagram illustrating a layout of a padding cell according to an exemplary embodiment of the present inventive concept, and FIGS. 16A and 16B are cross-sectional views of a padding cell that may have the same layout as the padding cell of FIG. 15, according to an exemplary embodiment of the present inventive concept.

FIG. 16A is a cross-sectional view of the padding cell PCL2 cut along a line F-F' and FIG. 16B is a cross-sectional view of the padding cell PCL2 cut along a line G-G'. The padding cell PCL2 of FIGS. 15, 16A and 16B may be a modified cell corresponding to the standard cell SCL as described with reference to FIGS. 7, 8A, 8B and 8C. The padding cell PCL2 is similar to the standard cell SCL of FIG. 7 and the padding cell PCL1 of FIG. 12, and thus, repeated descriptions may be omitted. The fin shape, gate insulation layers, interlayer insulation layers, etc. as described above are omitted in FIGS. 15, 16A and 16B.

As described above, by adding the dummy gate line DPC, the cell width CW2 of the padding cell PCL2 may be greater than the cell width CW of the corresponding standard cell SCL. The cell height CH2 of the padding cell PCL2 may be equal to the cell height CH of the standard cell SCL.

The dummy gate line DPC in the padding cell PCL1 of FIG. 12 is disposed between the fourth gate line 14 and the fifth gate line 15. In contrast, the dummy gate line DPC in the padding cell PCL2 of FIG. 15 is disposed between the third gate line 13 and the fourth gate line 14. As such, by determining the location of the dummy gate line DPC properly, the number of the jogging portions of the internal connection wiring 78 may be reduced.

As illustrated in FIGS. 16A and 16B, the jumper structure JMP as described above is formed at the second gate segment DPC2 of the dummy gate line DPC, and thus, the second gate segment DPC2 may be electrically connected to the active regions 114 and 115 at both sides of the second gate segment DPC2 through the jumper structure JMP. In addition, a lower via contact 58 may be formed on the jumper structure IMP to electrically connect the jumper structure JMP and the internal connection wiring 78. As a result, the active regions 114 and 115 may be electrically connected to the internal connection wiring 78 through the dummy gate line DPC, the jumper structure JMP and the lower via contact 58.

Figure 17:
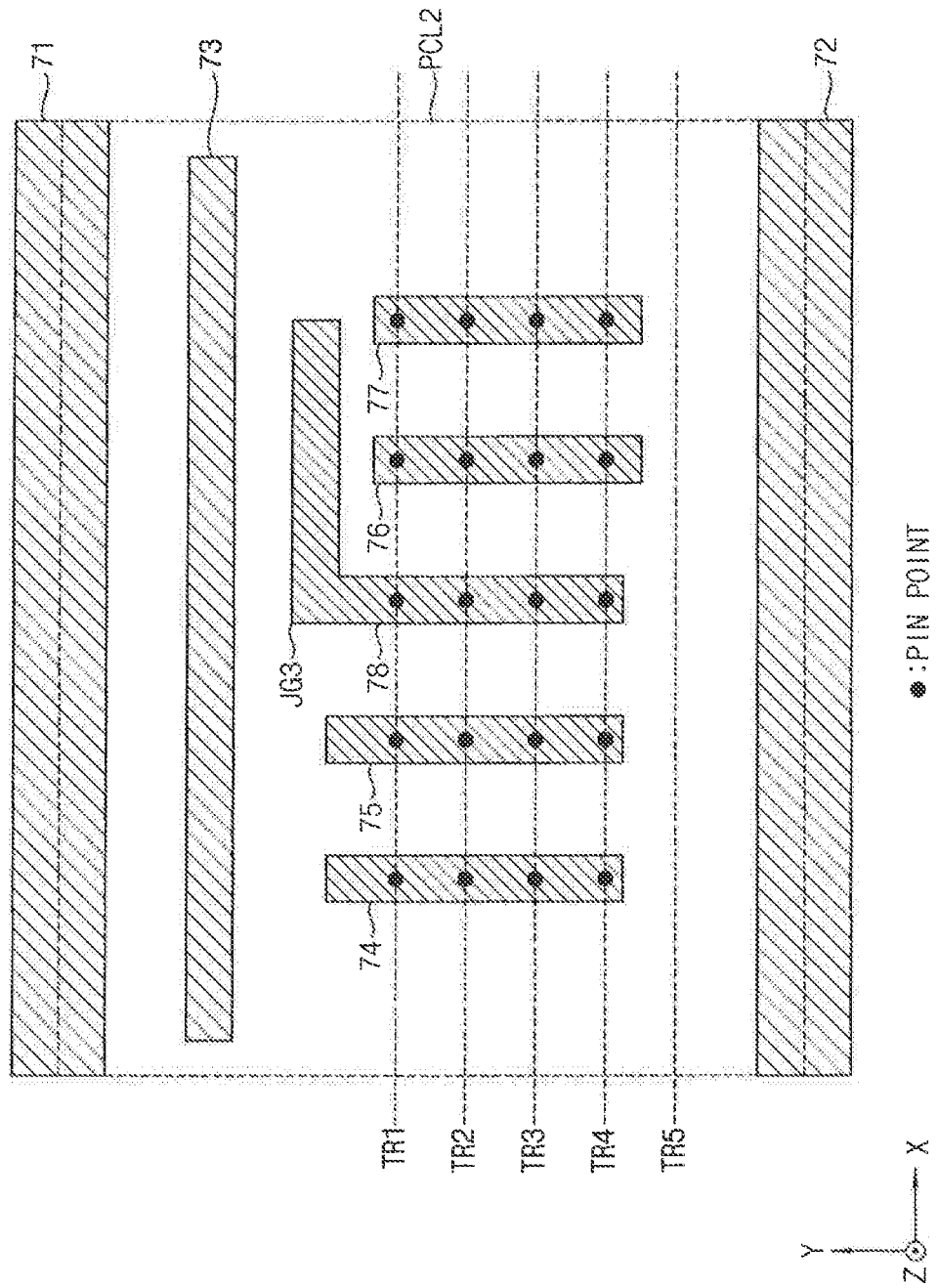
FIG. 17 is a diagram illustrating pin points of the padding cell of FIG. 15, according to an exemplary embodiment of the present inventive concept.

FIG. 17 is a diagram illustrating pin points of the padding cell of FIG. 15, according to an exemplary embodiment of the present inventive concept.

For convenience, only the wirings, for example, first through eighth wirings 71~78 among the elements in FIG. 15 are illustrated in FIG. 17. In addition, the routing grids or the routing tracts, for example, first through fifth tracts TR1~TR5, which are formed over the padding cell PCL2, are illustrated together in FIG. 17.

As illustrated in FIG. 17, the fourth wiring 74 may have four pin points, the fifth wiring 75 may have four pin points, the sixth wiring 76 may have four pin points, the seventh wiring 77 may have four pin points and the eighth wiring 78 may have four pin points.

Comparing FIGS. 11 and 17, the number of the pin points of the padding cell PCL2 may be increased in comparison with the corresponding standard cell SCL, using the dummy gate line DPC and the internal connection wiring 78. In addition, comparing FIGS. 14 and 17, the internal connection wiring 78 in the padding cell PCL2 of FIG. 17 has one jogging portion JG3 whereas the internal connection wiring 78 in the padding cell PCL1 of FIG. 14 has the two jogging portions JG1 and JG2. As such, the internal connection wiring 78 may be implemented to have only one jogging portion or no jogging portion, and thus, the number of the pin points may be further increased and the routability may be further increased.

Figure 18:
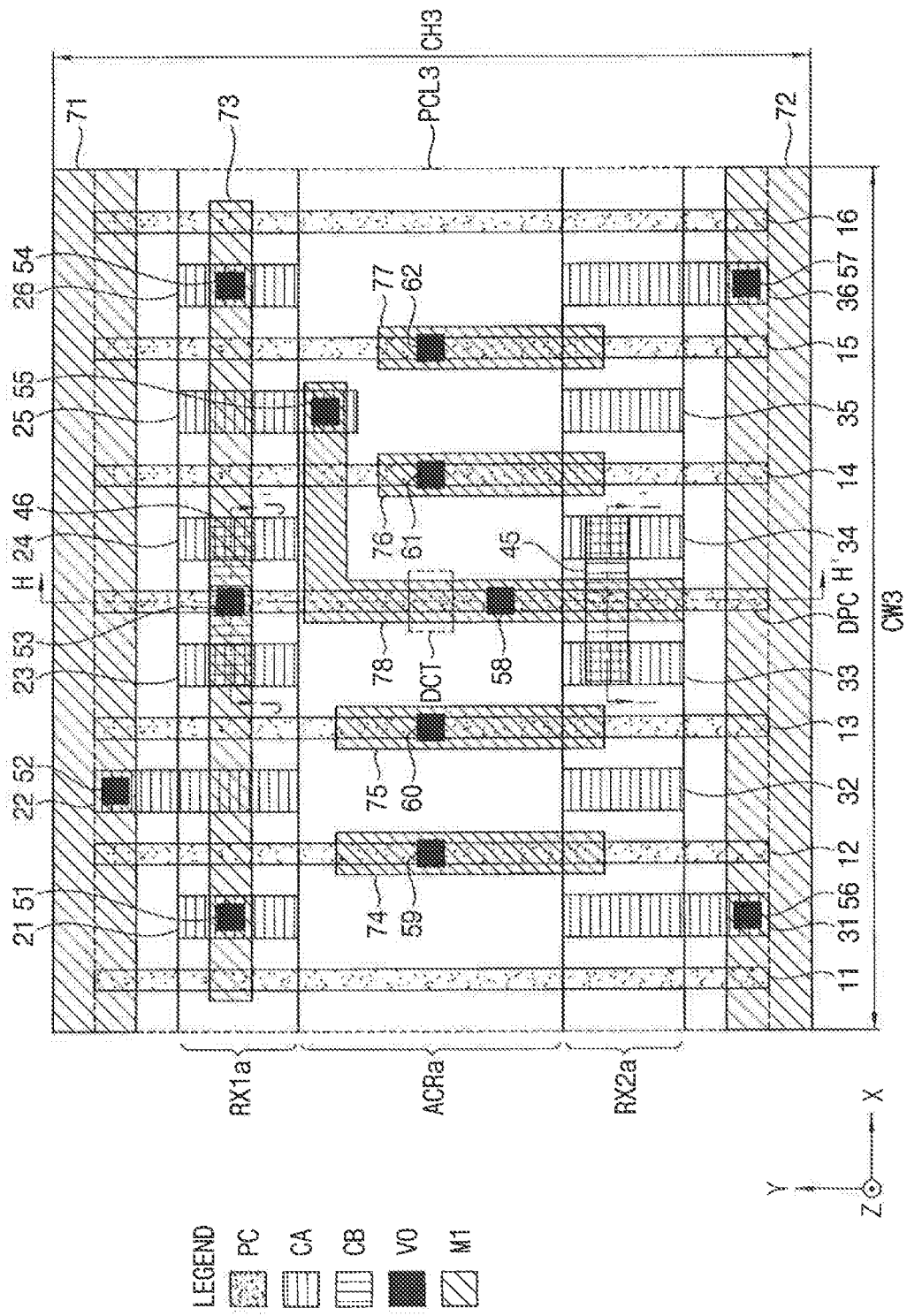
FIG. 18 is a diagram illustrating a layout of a padding cell according to an exemplary embodiment of the present inventive concept.
Figure 19B:
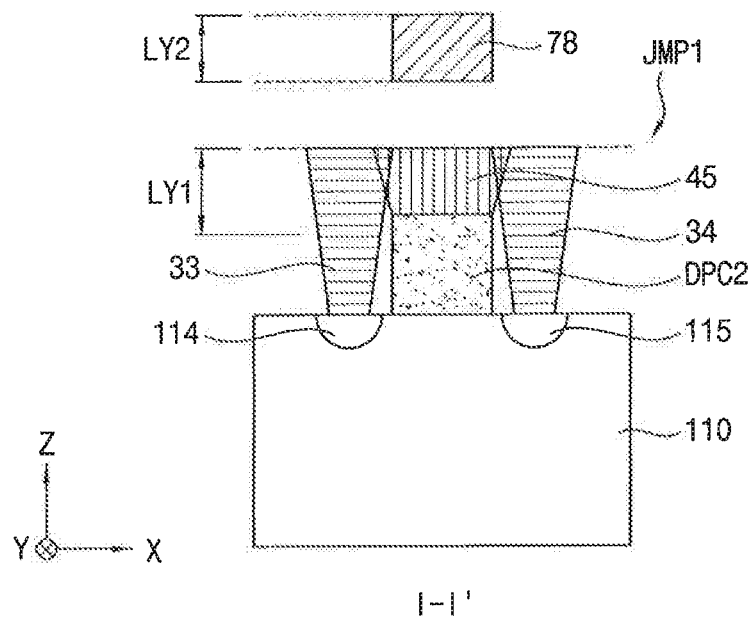
Figure 19C:
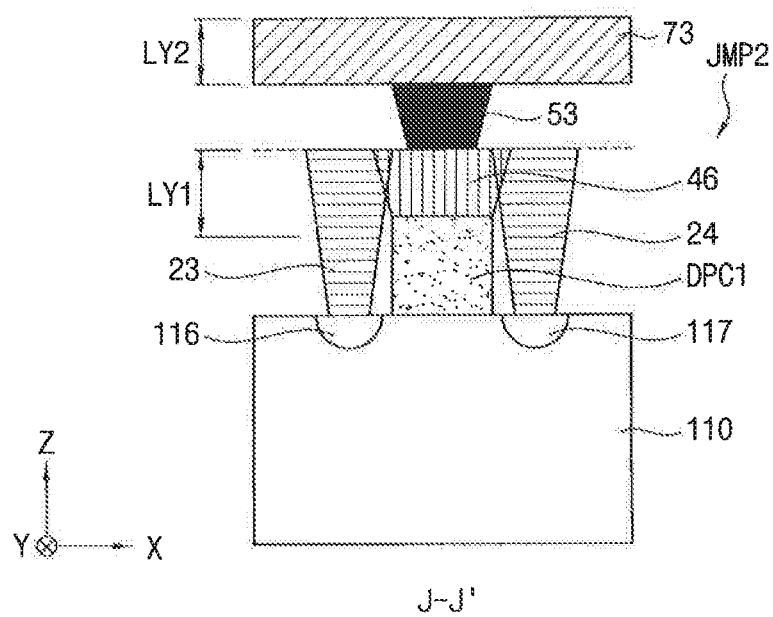

FIG. 18 is a diagram illustrating a layout of a padding cell according to an exemplary embodiment of the present inventive concept, and FIGS. 19A, 19B and 19C are cross-sectional views of a padding cell that may have the same layout as the padding cell of FIG. 18, according to an exemplary embodiment of the present inventive concept.

FIG. 19A is a cross-sectional view of the padding cell PCL3 cut along a line H-H', FIG. 19B is a cross-sectional view of the padding cell PCL3 cut along a line I-I', and FIG. 19C is a cross-sectional view of the padding cell PCL3 cut along a line J-J'. The padding cell PCL3 of FIGS. 18, 19A, 19B and 19C may be a modified cell corresponding to the standard cell SCL as described with reference to FIGS. 7, 8A, 8B and 8C. The padding cell PCL3 is similar to the standard cell SCL of FIG. 7 and the padding cells PCL1 and PCL2 of FIGS. 12 and 15, and thus, repeated descriptions may be omitted. The fin shape, gate insulation layers, interlayer insulation layers, etc. as described above are omitted in FIGS. 18, 19A, 19B and 19C.

As described above, by adding the dummy gate line DPC, the cell width CW3 of the padding cell PCL3 may be greater than the cell width CW of the corresponding standard cell SCL. The cell height CH3 of the padding cell PCL3 may be equal to the cell height CH of the standard cell SCL.

Comparing FIGS. 15 and 18, the width of the device areas RX1a and RX2a in the padding cell PCL3 of FIG. 18 is shorter than the width of the device areas RX1 and RX2 in the padding cell PCL2 of FIG. 15, whereas the width of the active cut region ACRa in the padding cell PCL3 of FIG. 18 is longer than the width of the active cut region ACR in the padding cell PCL2 of FIG. 15. Accordingly the number of the fins formed in the device areas RX1a and RX2a of FIG. 18 may be smaller than that of FIG. 15. As described above, the fins are extended in the first direction X and arranged in the second direction Y. For example, three or four fins may be formed along the second direction Y in each of the device areas RX1 and RX2 of FIG. 15 whereas two fins may be formed along the second direction Y in each of the device areas RX1a and RX2a of FIG. 18.

As illustrated in FIGS. 19A and 19B, the jumper structure JMP as described above is formed at the second gate segment DPC2 of the dummy gate line DPC, and thus, the second gate segment DPC2 may be electrically connected to the active regions 114 and 115 at both sides of the second gate segment DPC2 through the jumper structure JMP. In addition, an additional contact 47 may be formed on the second gate segment DPC2 and placed apart from the jumper structure JMP1, and a via contact 58 may be formed on the additional contact 47 to electrically connect the additional contact 47 and the parallel wiring segment of the internal connection wiring 78. As such, the contacts 45 and 47 may be formed on respective positions of the second gate segment DPC2 to facilitate the electrical connection between the active regions 114 and 115 and the internal connection wiring 78. The electrical connections using the contacts 45 and 47 may be used when the width of the devices areas RX1a and RX2a is relatively short, for example.

As illustrated in FIGS. 19A and 19C, the jumper structure JMP2 including first contacts 23 and 24 and the second contact 46 as described above is formed at the first gate segment DPC1 of the dummy gate line DPC, and thus, the first gate segment DPC1 may be electrically connected to active regions 116 and 117 at both sides of the first gate segment DPC1 through the jumper structure JMP2. In addition, a lower via contact 53 may be formed on the jumper structure JMP2 to electrically connect the jumper structure JMP2 and the wiring 73. As a result, the active regions 116 and 117 may be electrically connected to the wiring 73 through the first gate segment DPC1, the jumper structure JMP2 and the lower via contact 53.

According to exemplary embodiments of the present inventive concept, at least one of the wirings in the padding cell may be a stitch wiring. The stitch wiring is a wiring including a portion STC that is overlapped by two portions formed by different etching masks. For example, as illustrated in FIG. 19A, the internal connection wiring 78 may be a stitch wiring that includes an overlapped portion STC. The stitch wiring is further described with reference to FIGS. 22A, 22B and 22C.

Figure 20:
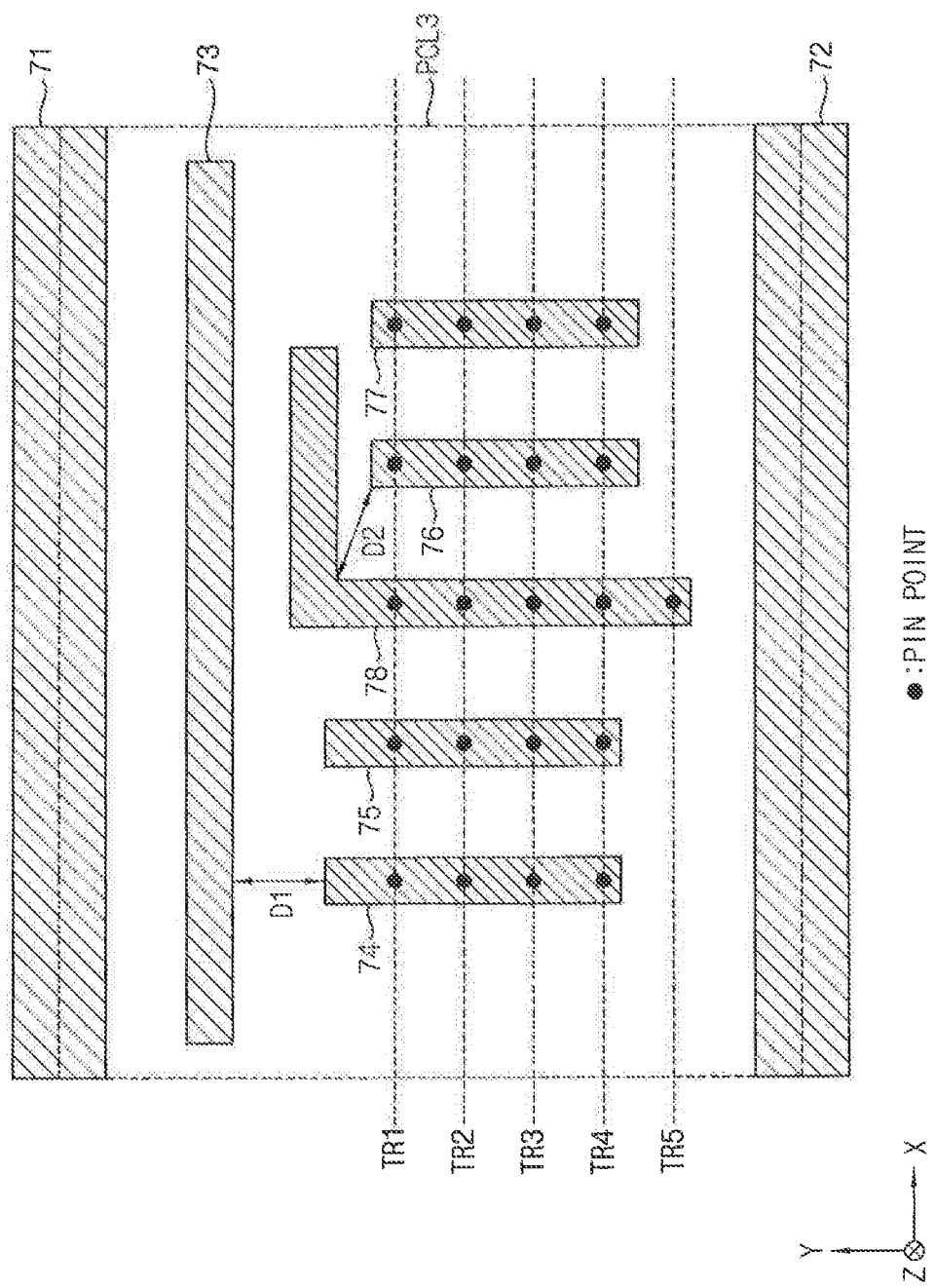
FIG. 20 is a diagram illustrating pin points of the padding cell of FIG. 18, according to an exemplary embodiment of the present inventive concept.

FIG. 20 is a diagram illustrating pin points of the padding cell of FIG. 18, according to an exemplary embodiment of the present inventive concept.

For convenience, only the wirings, for example, first through eighth wirings 71~78 among the elements in FIG. 18 are illustrated in FIG. 20. In addition, the routing grids or the routing tracts, for example, first through fifth tracts TR1~TR5, which are formed over the padding cell PCL3, are illustrated together in FIG. 20.

As illustrated in FIG. 20, the fourth wiring 74 may have four pin points, the fifth wiring 75 may have four pin points, the sixth wiring 76 may have four pin points, the seventh wiring 77 may have four pin points and the eighth wiring 78 may have five pin points. The internal connection wiring 78 in the padding cell PCL3 of FIG. 20 may be a stitch wiring. In this case, the internal connection wiring 78 in the padding cell PCL3 of FIG. 20 may have more pin points than the internal connection wiring 78 in the padding cell PCL2 of FIG. 17, and thus, the padding cell PCL3 may have more routability.

The standard cell and the padding cell corresponding to the standard cell have been described with reference to FIGS. 7 through 20. The size of the padding cell may be increased due to the dummy gate line in comparison with the corresponding standard cell. However, the padding cell may have increased routability due to the internal connection wiring, the jumper structure, a reduction of the jogging portions, and the contacts formed on respective positions of each gate segment. Thus, even though the size of the padding cell may be larger than the corresponding standard cell, the entire size of the integrated circuit using the padding cell may be reduced because the padding cell has the increased routability.

Distances D1 and D2 between some of the wirings 71~78 are represented in FIG. 20. Hereinafter, restrictions of the distances D1 and D2 between the wirings are described with reference to FIGS. 21A and 21B.

Figure 21A:
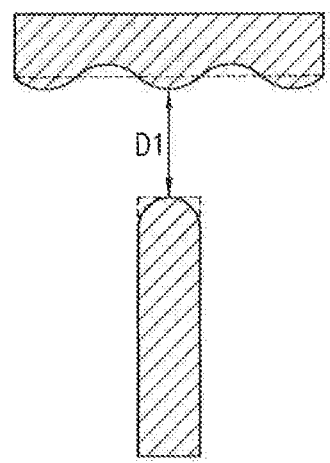
FIG. 21A is a diagram for describing a tip-to-side restriction.
Figure 21B:
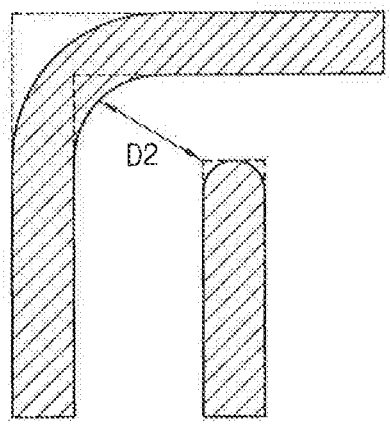
FIG. 21B is a diagram for describing a corner rounding restriction.

FIG. 21A is a diagram for describing a tip-to-side restriction, and FIG. 21B is a diagram for describing a corner rounding restriction.

FIG. 21A is a diagram for describing the tip-to-side restriction associated with a minimum distance D1 between wirings as illustrated in FIG. 20. The term "tip-to-side" may denote a shortest distance between a tip of a wiring and a lateral edge of another wiring.

When the two adjacent wirings 73 and 74 are formed by using a single photomask and are disposed to orthogonally cross each other, if a shortest distance D1 according to a tip-to-side minimum spacing rule is not maintained between the two adjacent wirings 73 and 74, a tip-to-side violation may occur. For example, ripples may be formed at a lateral edge of the wiring (upper wiring) as illustrated in FIG. 21A, when the tip-to-side violation occurs. The ripples may cause a large deviation in widths of the wirings. In addition, if the ripples described above are formed, a minimum insulation distance may not be secured between the wiring that has the ripples and another wiring of a different color that is formed at the same level as the wiring having the ripples by using another photomask.

FIG. 21B is a diagram for describing the corner rounding restriction associated with a minimum distance D2 between wirings as illustrated in FIG. 20. If corner rounding occurs in a jogging portion of the wiring 78, a radius of curvature of each of an inner circumferential portion and an outer circumferential portion of the rounded corner are not scaled proportionally to a pitch of wirings. For example, this may occur even if the pitch is reduced in the wirings. Thus, as the pitch of the wirings is gradually reduced due to the development of multi-patterning technology, the effect and significance of the radius of curvature of the rounded corner further increases. For example, in a litho-etch-litho-etch-litho-etch (LELELE) operation, which is a triple patterning operation that includes a triple exposure operation, near a jogging portion or a bent portion of the wiring 78 at the same level as the wiring 76, to maintain a minimum insulation distance D2 from the wiring 76 of a different color, corner rounding that may occur in the jogging portion of the wiring 78 is considered. The wiring 76 of the different color is formed by using another photomask, for example.

Figure 22A:
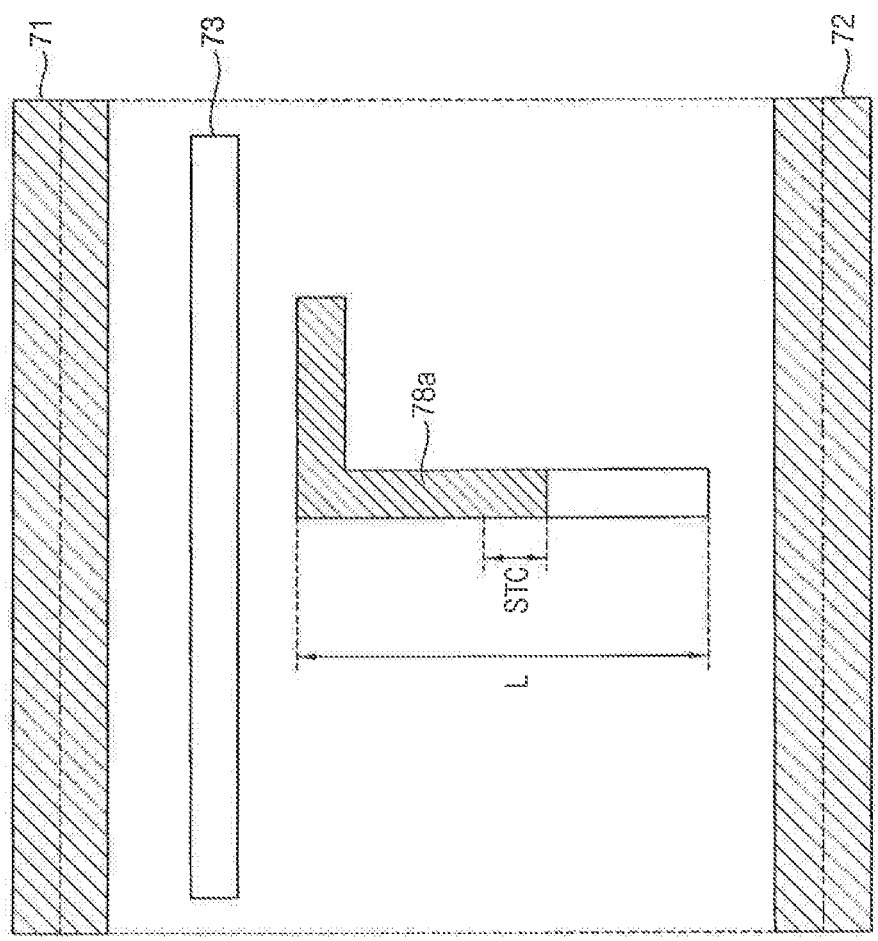
FIGS. 22A, 22B and 22C are diagrams for describing a stitch wiring according to an exemplary embodiment of the present inventive concept.
Figure 22B:
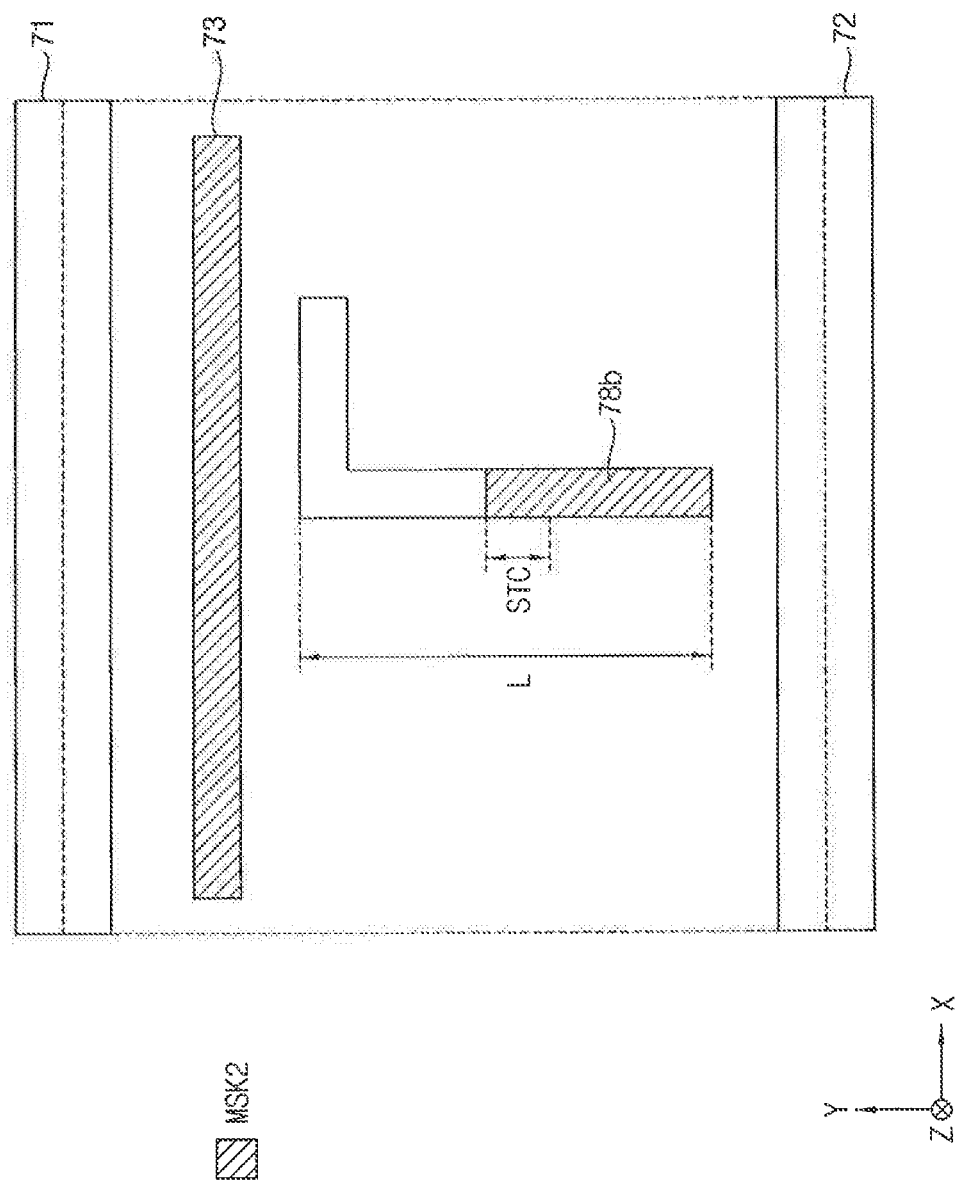
Figure 22C:
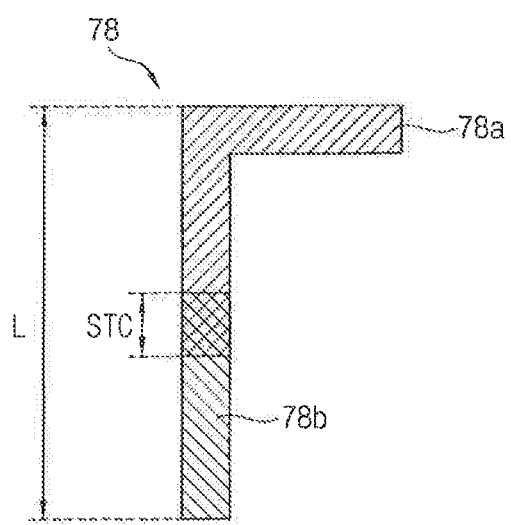

FIGS. 22A, 22B and 22C are diagrams for describing a stitch wiring according to an exemplary embodiment of the present inventive concept.

FIG. 22A illustrates wirings 71, 78a and 72 that are formed using a first etching mask MSK1, and FIG. 22B illustrates wirings 73 and 78b that are formed using a second etching mask MSK1 of a different color. Due to restrictions of processing scale, the etching masks MSK1 and MSK2 of the different colors may be used.

FIG. 22C illustrates a stitch wiring 78 including a portion STC that is overlapped by the portion 78a formed by the first etching mask MSK1 and the portion 78b formed by the second etching mask MSK2. By implementing at least one wiring of the wirings in the modified cell as a stitch wiring, the number of the pin points of the modified cell may be increased and the routability of the modified cell may be further increased.

Figure 23:
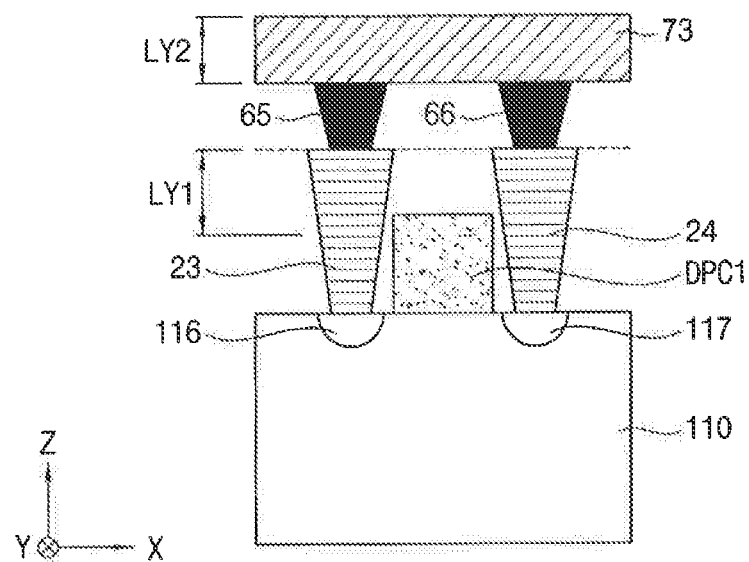
FIGS. 23 and 24 are diagrams for describing padding cells according to exemplary embodiments of the present inventive concept.
Figure 24:
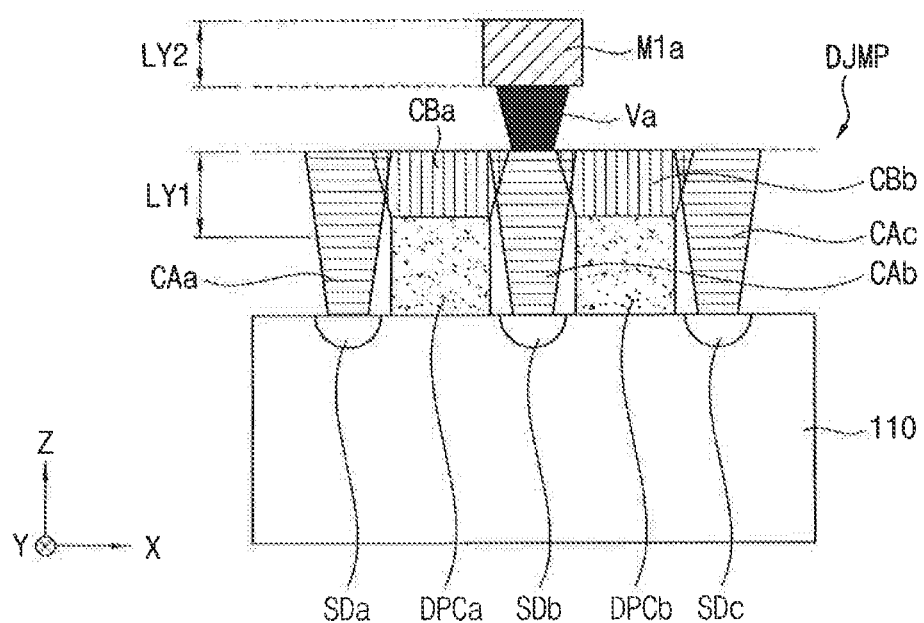

FIGS. 23 and 24 are diagrams for describing padding cells according to exemplary embodiments of the present inventive concept.

FIG. 23 illustrates a modification of the jumper structure JMP2 of FIG. 19C. The cross-sectional view of FIG. 23 is similar to that of FIG. 19C, and thus, repeated descriptions are omitted.

As described with reference to FIG. 19C, the jumper structure JMP2 is formed at the first gate segment DPC1 of the dummy gate line DPC, and thus, the first gate segment DPC1 may be electrically connected to the active regions 116 and 117 at both sides of the first gate segment DPC1 through the jumper structure JMP2. In addition, the lower via contact 53 may be formed on the jumper structure JMP2 to electrically connect the jumper structure JMP2 and the wiring 73.

In the embodiment of FIG. 23, the second contact 46 of FIG. 19C is omitted to electrically separate the first gate segment DPC1 of the dummy gate line DPC from the active regions 116 and 117. Lower via contacts 65 and 66 are formed on the first contacts 23 and 24 to electrically connect the active regions 116 and 117 to the wiring 73.

Referring to FIG. 24, a plurality of dummy gate lines DPCa and DPCb may be formed on the substrate 110. The dummy gate lines DPCa and DPCb may be extended in the second direction Y and arranged in the first direction X. As described above, each of the dummy gate lines DPCa and DPCb may include two gate segments that are separated by the gate cut region DCT. Although FIG. 24 illustrates the two dummy gate lines arranged in the first direction X, three or more dummy gate lines may be arranged sequentially in the first direction X.

A plurality of conductive contacts are formed at a first layer LY1, including first contacts CAa, CAb and CAc connected to active regions SDa, SDb and SDc and second contacts CBa and CBb connected to the dummy gate lines DPCa and DPCb.

FIG. 24 illustrates a double jumper structure DJMP. In the double jumper structure DJMP, the first contacts CAa, CAb and CAc formed on the active regions SDa, SDb and SDc and the second contacts CBa and CBb formed on the dummy gate lines DPCa and DPCb are fused, for example, insepa- rably. Using the double jumper structure DJMP, the dummy gate lines DPCa and DPCb may be electrically connected to the active regions SDa, SDb and SDc.

A wiring M1a that is formed at a second layer LY2 which is higher than the first layer LY1 may be electrically con- nected to the double jumper structure DJMP through the lower via contact Va formed between the first layer LY1 and the second layer LY2. Using the double jumper structure DJMP, the area of the united active regions may be increased.

Although FIG. 24 illustrates that the lower via contact Va and the wiring M1a are formed at a center portion of the double jumper structure DJMP, the position of the lower via contact Va and the wiring M1a is not limited thereto.

Figure 25:
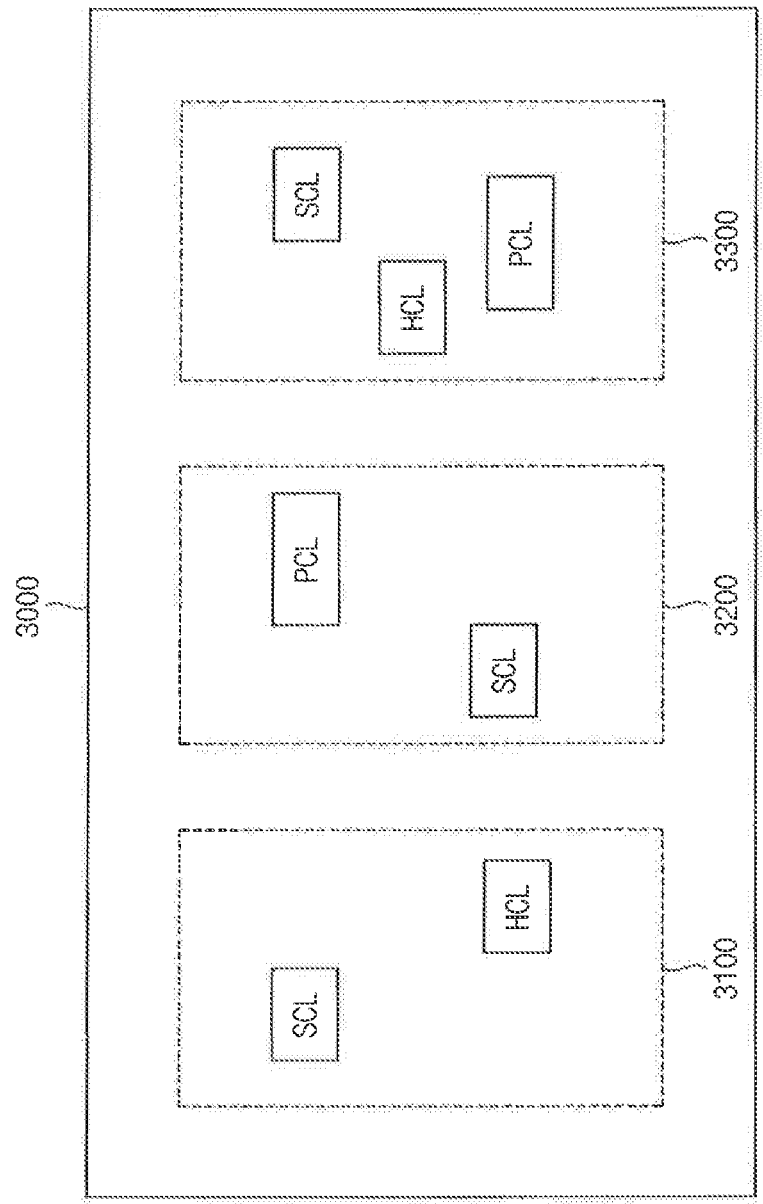
FIG. 25 is a diagram illustrating a layout of an integrated circuit according to an exemplary embodiment of the present inventive concept.

FIG. 25 is a diagram illustrating a layout of an integrated circuit according to an exemplary embodiment of the present inventive concept.

Referring to FIG. 25, an integrated circuit 3000 may include a plurality of function blocks, for example, first through third function blocks 3100, 3200 and 3300.

The first function block 3100 may include a standard cell SCL and a hybrid cell HCL corresponding to the standard cell SCL. As described above, the hybrid cell HCL is one of the modified cells such that the width of the power rail of the hybrid cell HCL is smaller than the width of the power rail of the corresponding standard cell SCL.

The second function block 3200 may include a standard cell SCL and a padding cell PCL corresponding to the standard cell SCL. As described above, the padding cell PCL is one of the modified cells such that the padding cell PCL further includes a dummy gate line in comparison with the corresponding standard cell SCL.

The third function block 3300 may include a standard cell SCL, a hybrid cell HCL and a padding cell PCL. The hybrid cell HCL and the padding cell PCL may correspond to the same standard cell SCL or different standard cells.

Although FIG. 25 illustrates that each of the function blocks 3100, 3200 and 3300 includes one standard cell SCL, each of the function blocks 3100, 3200 and 3300 may include a plurality of standard cells. The plurality of stan- dard cells may be of the same kind or different kinds. The number of the modified cells HCL and PCL may be deter- mined variously depending on the configurations of the function blocks 3100, 3200 and 3300.

The hybrid cell HCL and/or the padding cell PCL may be used selectively according to characteristics of the function blocks 3100, 3200 and 3300. For example, the hybrid cell HCL may be used if the modified cell of the same size as the standard cell SCL is required, or the padding cell PCL may be used if the size of the modified cell is less restricted. As described above, the hybrid cell HCL and the padding cell PCL have the same function as the corresponding standard cell SCL and have higher routability than the standard cell SCL. Using the hybrid cell HCL and/or the padding cell PCL, the design of the integrated circuit may be conve- niently performed and the occupation area of the integrated circuit may be reduced.

Figure 26:
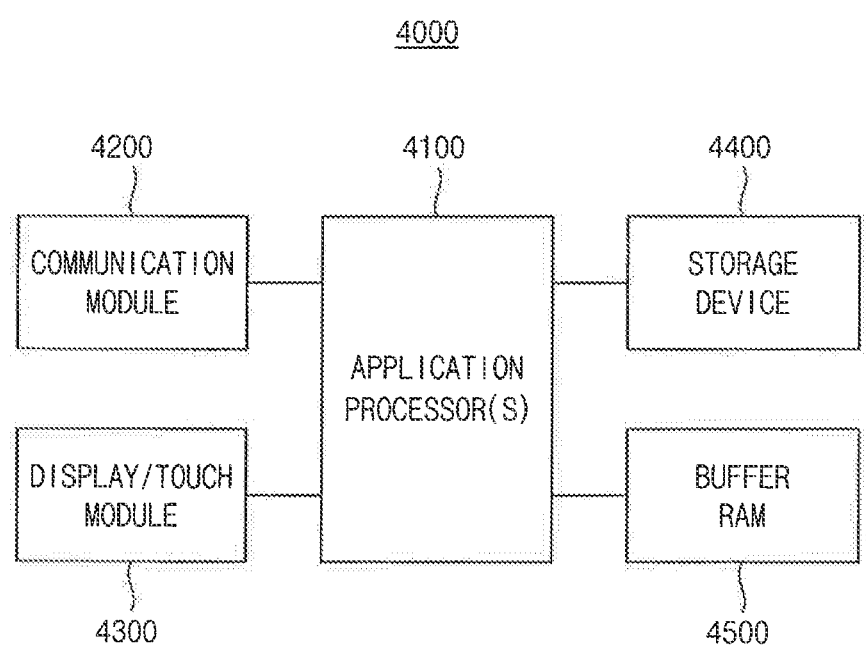
FIG. 26 is a block diagram illustrating a mobile device according to an exemplary embodiment of the present inventive concept.

FIG. 26 is a block diagram illustrating a mobile device according to an exemplary embodiment of the present inventive concept.

Referring to FIG. 26, a mobile device 4000 may include an application processor 4100, a communication module 4200, a display/touch module 4300, a storage device 4400, and a buffer RAM 4500.

The application processor 4100 controls operations of the mobile device 4000. The communication module 4200 can perform wireless or wired communications with an external device. The display/touch module 4300 can display data processed by the application processor 4100 and/or receive data through a touch panel. The storage device 4400 can store user data. The storage device 4400 may be an embed- ded multimedia card (eMMC), a solid state drive (SSD), a universal flash storage (UFS) device, etc. The storage device 4400 may include a power loss protection circuit and a capacitor module to perform efficient management of power and performance of the mobile device 4000. The buffer RAM 4500 temporarily stores data used for processing operations of the mobile device 4000. For example, the buffer RAM 4500 may be a double data rate (DDR) syn- chronous dynamic random access memory (SDRAM), a low power DDR (LPDDR) SDRAM, a graphics DDR (GDDR) SDRAM, a Rambus DRAM (RDRAM), etc.

As described above, the integrated circuit and the method of designing the integrated circuit according to exemplary embodiments of the present inventive concept may reduce an occupation area of the integrated circuit by using a modified cell that has the same function as a standard cell and enhanced routability compared with the standard cell.

The exemplary embodiments described herein may be applied to any devices and systems. For example, the exemplary embodiments presented herein may be applied to systems such as a mobile phone, a smart phone, a personal digital assistant (PDA), a portable multimedia player (PMP), a digital camera, a camcorder, a personal computer (PC), a server computer, a workstation, a laptop computer, a digital television (TV), a set-top box, a portable game console, a navigation system, etc.

While the present inventive concept has been particularly shown and described with reference to exemplary embodi- ments thereof, it will be apparent to those of ordinary skill in the art that various changes in form and detail may be made therein without departing from the spirit and scope of the present inventive concept as defined by the following claims.

What is claimed is:

1. A standard cell having a cell height defined by a first boundary line and a second boundary line, the standard cell comprising;
   a semiconductor substrate;
   a first power rail disposed above the semiconductor substrate at the first cell boundary line, the first power rail extending in a row direction; and
   a second power rail disposed above the semiconductor substrate at the second cell boundary line, the second power rail extending in the row direction in parallel to the first power rail,
   wherein at least one of the first power rail and. the second power rail is asymmetrically divided by at least one of the first boundary line and the second boundary line such that a first width of a first portion of the at least one of the first power rail and the second power rail is different from a second width of a second portion of the at least one of the first power rail and the second. power rail,
   wherein each of the first power rail and the second power rail is divided by each of the first boundary line and the second boundary line into the first portion of the first width within the cell height and the second portion of the second width out of the cell height, and the first width of at least one of the first power rail and the second power rail is different from the second width of the at least one of the first power rail and the second power rail.

2. The standard cell of claim 1, Wherein the first width of a first one of the first power rail and the second power rail is smaller than the second width of the first one of the first power rail and the second power rail, and the first width of a second one of the first power rail and the second power rail is equal to the second width of the second one of the first power rail and the second power rail.

3. The standard cell of claim 1, wherein the first width of both of the first power rail and the second power rail is smaller than the second width of the both of the first power rail and the second power rail.

4. The standard cell of claim 1, wherein the first width or the second width of at least one of the first power rail and the second power rail of the standard cell is smaller than a width of a power rail of another standard cell.

5. The standard cell of claim 1, wherein the standard cell has a same function and a same size as a corresponding standard cell and has a higher mutability than the corresponding standard cell.

6. The standard cell of claim 5, wherein a number of pin points of the modified cell is larger than a number of pin points of another standard cell, wherein the pin points are positions for signal input or signal output.

7. The standard cell of claim 1, wherein the semiconductor substrate includes a first device area, a second device area and an active cut area separating the first and second device areas, and a plurality of fin-type active areas are vertically protruded from the semiconductor substrate in each of the first and second device areas.

8. An integrated circuit comprising:
   a semiconductor substrate;
   a plurality of standard cells formed at the semiconductor substrate; and
   a plurality of power rails disposed above the semiconductor substrate at cell boundary regions, the plurality of power rails extending in a row direction in parallel to one another,
   wherein the plurality of standard cells include a first standard cell having a cell height defined by a first boundary line and a second boundary line and a second standard cell having the cell height defined by a third boundary line and a fourth boundary line,
   wherein the plurality of power rails include a first power rail disposed at the first boundary line, a second power rail disposed at the second boundary line, a third power rail disposed at the third boundary line, and a fourth power rail disposed at the fourth boundary line,
   Wherein at least one of the third power rail and the fourth power rail of the second standard cell is asymmetrically divided by at least one of the first boundary line and the second boundary line,
   wherein each of the third power rail and the fourth power rail is divided by each of the third boundary line and the fourth boundary line into a first portion of a first width within the cell height and a second portion of a second width out of the cell height, and the first width of at least one of the third power rail and the fourth power rail of the second standard cell is different from the second width of the at least one of the first power rail and the second power rail of the second standard cell.

9. The integrated circuit of claim 8, wherein both of the first power rail and the second power rail of the first standard cell are symmetrically divided by both of the first boundary line and the second boundary line.

10. The integrated circuit of claim 8, wherein a width of at least one of the third power rail and the fourth power rail of the second standard cell is different from a width of the at least one of the first power rail and the second power rail of the first standard cell.

11. The integrated circuit of claim 8, wherein the first width of both of the first power rail and the second power rail of the first standard cell is equal to the second width of the both of the first power rail and the second power rail of the first standard cell.

12. The integrated circuit of claim 8, wherein the first width of at least one of the third power rail and the fourth power rail of the second standard cell is smaller than the second width of the at least one of the third power rail and the fourth power rail of the second standard cell.

13. The integrated circuit of claim 8, wherein the plurality of standard cells further include a third standard cell such that the second standard cell has a same function and a same size as the third standard cell and the second standard cell has a higher routability than the third standard cell.

14. The integrated circuit of claim 13, wherein a number of pin points of the second standard cell is larger than a number of pin points of the third standard cell, wherein the pin points are positions for signal input or signal output.

15. The integrated circuit of claim 8, wherein the semiconductor substrate includes a first device area, a second device area and an active cut area separating the first and second device areas, and a plurality of fin-type active areas are vertically protruded from the semiconductor substrate in each of the first and second device areas.

16. The integrated circuit of claim 8, wherein plurality of standard cells include a third standard cell, the third standard cell including
   a dummy gate line disposed above the semiconductor substrate;
   at least one jumper structure that includes first contacts formed on active regions of the semiconductor substrate at both sides of the dummy gate line and a second contact formed on the dummy gate line to electrically connect the active regions to the dummy gate line; and an internal connection wiring that is electrically connected to the dummy gate line.

17. The integrated circuit of claim 8, wherein the plurality of standard cells include a third standard cell, the third standard cell including:
   a dummy gate line disposed above the semiconductor substrate, the dummy gate line including a first gate segment and a second gate. segment that are separated by a gate cut region;
   a first jumper structure electrically connecting the first gate segment to active regions of the semiconductor substrate at both sides of the first gate segment; and
   a second jumper structure electrically connecting the first gate segment to active regions of the semiconductor substrate at both sides of the second gate segment.

18. An integrated circuit comprising:
   a semiconductor substrate including a plurality of fin-type active areas that are vertically protruded from the semiconductor substrate;
   a first standard cell formed at the semiconductor substrate, the first standard cell having a cell height defined by a first boundary line and a second boundary line;
   a second standard cell formed at the semiconductor substrate, the second standard cell having the cell height defined by the a third boundary line and a fourth boundary line;
   a third standard cell formed at the semiconductor substrate, the third standard cell having the cell height defined by a fifth boundary line and a sixth boundary line;
   a first, second, third, fourth, fifth, and sixth power rail disposed above the semiconductor substrate at the first through sixth cell boundary lines, respectively, the first through sixth power rails extending in the row direction,
   wherein a first width of at least one of the first power rail and the second power rail of the first standard cell is different from a second width of at least one of the third power rail and the fourth power rail of the second standard cell, the second width is different from a third width of the fifth power rail and the sixth power rail of the third standard cell, and the third width is different from the first width,
   wherein each of the first power rail and the second power rail is divided by each of the first boundary line and the second boundary line into a first portion of the first width within the cell height and a second portion of another width out of the cell height, and the first width of at least one of the first power rail and the second power rail is different from the another width. of the at least one of the first power rail and the second power rail.

* * * * *